US009070399B2

(12) United States Patent
Hamaguchi et al.

(10) Patent No.: US 9,070,399 B2
(45) Date of Patent: Jun. 30, 2015

(54) POLISHING LIQUID COMPOSITION FOR MAGNETIC-DISK SUBSTRATE

(75) Inventors: Takeshi Hamaguchi, Wakayama (JP); Haruhiko Doi, Wakayama (JP)

(73) Assignee: Kao Corporation, Tokyo (JP)

( * ) Notice: Subject to any disclaimer, the term of this patent is extended or adjusted under 35 U.S.C. 154(b) by 491 days.

(21) Appl. No.: 13/133,736

(22) PCT Filed: Dec. 18, 2009

(86) PCT No.: PCT/JP2009/071160
§ 371 (c)(1),
(2), (4) Date: Jun. 9, 2011

(87) PCT Pub. No.: WO2010/074002
PCT Pub. Date: Jul. 1, 2010

(65) Prior Publication Data
US 2011/0240594 A1 Oct. 6, 2011

(30) Foreign Application Priority Data

Dec. 22, 2008 (JP) .................. 2008-326362
Dec. 22, 2008 (JP) .................. 2008-326363
Jul. 24, 2009 (JP) .................. 2009-173203
Sep. 8, 2009 (JP) .................. 2009-207201

(51) Int. Cl.
| C09K 13/06 | (2006.01) |
| G11B 5/84 | (2006.01) |
| C23F 3/00 | (2006.01) |
| C09G 1/02 | (2006.01) |
| H01L 21/321 | (2006.01) |

(52) U.S. Cl.
CPC .............. *G11B 5/8404* (2013.01); *C23F 3/00* (2013.01); *H01L 21/3212* (2013.01); *C09G 1/02* (2013.01)

(58) Field of Classification Search
CPC . C23F 3/00; B81C 2201/0104; C09K 3/1463; C09G 1/02; B24B 1/00; H01L 21/3212; H01L 21/30625
USPC .................. 438/692, 693; 252/79.4
See application file for complete search history.

(56) References Cited

U.S. PATENT DOCUMENTS

| 6,440,856 | B1 * | 8/2002 | Bessho et al. .................. 438/691 |
| 6,641,630 | B1 | 11/2003 | Sun |
| 2003/0054297 | A1 * | 3/2003 | Hosokawa .................... 430/350 |
| 2004/0065021 | A1 | 4/2004 | Yoneda et al. |
| 2005/0076581 | A1 * | 4/2005 | Small et al. ...................... 51/307 |
| 2006/0030243 | A1 | 2/2006 | Nishimoto et al. |
| 2008/0006057 | A1 | 1/2008 | Nishimoto et al. |
| 2008/0045016 | A1 * | 2/2008 | Andou et al. .................. 438/692 |
| 2008/0086951 | A1 | 4/2008 | Wakamiya et al. |
| 2008/0115422 | A1 * | 5/2008 | Suzuki et al. ..................... 51/298 |
| 2008/0131571 | A1 * | 6/2008 | Nakayama et al. ........... 426/531 |
| 2010/0103698 | A1 * | 4/2010 | Yokota et al. .................. 362/611 |
| 2010/0221918 | A1 * | 9/2010 | Takemura et al. ............ 438/693 |
| 2011/0203186 | A1 | 8/2011 | Oshima et al. |
| 2011/0240594 | A1 | 10/2011 | Hamaguchi et al. |

FOREIGN PATENT DOCUMENTS

| JP | 2001-64631 A | 3/2001 |
| JP | 2004-27224 A | 1/2004 |
| JP | 2004-143429 A | 5/2004 |
| JP | 2006-102829 A | 4/2006 |
| JP | 2006-136996 A | 6/2006 |
| JP | 2007-231209 A | 9/2007 |
| JP | 2008-13655 A | 1/2008 |
| JP | 2008-137822 A | 6/2008 |
| JP | 2008-155368 A | 7/2008 |
| JP | 2008-169102 A | 7/2008 |
| JP | 2008-227098 A | 9/2008 |
| JP | 2008-296318 A | 12/2008 |
| JP | 2010-135052 A | 6/2010 |
| JP | 2010-170650 A | 8/2010 |
| TW | 200738858 A | 10/2007 |
| WO | WO 2007/108925 A2 | 9/2007 |

OTHER PUBLICATIONS

Wikipedia, The Free Encyclopedia; Polystyrene sulfonate http://en.wikipedia.org/wiki/Polystyrene_sulfonate ; pp. 1-4; Aug. 2013.*
Wikipedia, The Free Encyclopedia; 2-Acrylamido-2-methylpropane sulfonic acid , http://en.wikipedia.org/wiki/2-Acrylamido-2-methylpropane_sulfonic_acid ; pp. 1-4, Sep. 2, 2013.*
Wikipedia The Free Encyclopedia, "Methyl metharylate", http://en.wikipedia.org/wiki/Methyl_methacrylate ; pp. 1-6; 2014.*
International Search Report, dated Jan. 26, 2010 in PCT/JP2009/071160.
Mori, "The particle diameter distribution measurement of nanoparticles by the dynamic light scattering method", The 20th workshop on scattering, Doshisha University, Dec. 4, 2008, pp. 5-4-5-7.
Shibayama, "Dynamic light scattering", The 12th workshop on scattering, Inst. for Solid State Physics, The University of Tokyo, Nov. 22, 2000, pp. 1-24-1-27.
English language abstract and machine-translation of Japanese Publication No. 2009-113993-A, published May 28, 2009.
Taiwanese Office Action for Taiwanese Application No. 098144292, dated Feb. 18, 2014.

* cited by examiner

*Primary Examiner* — Binh X Tran
(74) *Attorney, Agent, or Firm* — Birch, Stewart, Kolasch & Birch, LLP

(57) ABSTRACT

There is provided a polishing composition for a magnetic disk substrate that can reduce scratches, nanoprotrusion defects, and substrate surface waviness after polishing. The polishing composition for a magnetic disk substrate that contains: a copolymer that has a constituent unit derived from a monomer having a solubility of 2 g or less in 100 g of water at 20° C. and a constituent unit having a sulfonic acid group, and has a saturated hydrocarbon chain as the main chain thereof, or a salt of the copolymer; an abrasive; and water.

9 Claims, No Drawings

POLISHING LIQUID COMPOSITION FOR MAGNETIC-DISK SUBSTRATE

TECHNICAL FIELD

The present invention relates to a polishing composition for a magnetic disk substrate, and a method for producing a magnetic disk substrate using the same.

BACKGROUND ART

With the recent advances in the reduction in size and the increase in capacity of magnetic disk drives, there is a need to increase the recording density. To increase the recording density, techniques for further reducing the flying height of magnetic heads are being developed so as to decrease the unit recording area and improve the detection sensitivity for a weakened magnetic signal. In order to take measures for reducing the flying height of magnetic heads and securing the recording area, the requirements for magnetic disk substrates are becoming increasingly stringent, with regard to the improvement of smoothness and flatness (the reduction of surface roughness, waviness, and roll-off) and the reduction of defects (the reduction of scratches, protrusions, pits and the like). To satisfy such requirements, polishing compositions containing a copolymer having a functional group such as a carboxyl group and a sulfonic acid group have been suggested (for example, see Patent Documents 1 to 3).

Patent Document 1 discloses a polishing composition suitable for chemical mechanical polishing (CMP) of semiconductor components. This polishing composition contains a polymer having a sulfonic acid group, and thus makes it possible to planarize the surface of an object to be polished, and also increase the polishing rate.

Patent Document 2 discloses a polishing composition for semiconductor components that is suitable for chemical mechanical polishing (CMP). This polishing composition contains at least two polymers selected from a polymer having a carboxylic acid group, a polymer having a sulfonic acid group, and a polymer having a phosphoric acid group, and thus makes it possible to reduce the surface roughness of an object to be polished, and also increase the polishing rate.

Patent Document 3 discloses a polishing composition for Ni metal-containing substrates. The polishing composition contains particles of a copolymeric resin having a functional group, such as a sulfonic acid group, capable of coordinating with a metal ion, instead of inorganic abrasive grains such as alumina and silica, and thus can suppress the occurrence of defects such as scratches and protrusions.

PRIOR ART DOCUMENTS

Patent Documents

Patent Document 1: JP 2001-064631A
Patent Document 2: JP 2008-155368A
Patent Document 3: JP 2007-231209A

DISCLOSURE OF INVENTION

Problem to be Solved by the Invention

Reducing scratches using conventional polishing compositions is not adequate for realizing a further increase in the capacity of magnetic disk drives, and it is necessary to further reduce the nanoprotrusion defects and substrate surface waviness, as well as scratches.

Further, with the increase in capacity, the recording scheme of magnetic disks has shifted from the horizontal magnetic recording scheme to the perpendicular magnetic recording scheme. The production process of magnetic disks for the perpendicular magnetic recording scheme does not require a texturing step, which is necessary to align the magnetization direction for the horizontal magnetic recording scheme, and a magnetic layer is formed directly on the surface of the substrate polishing. Accordingly, the required characteristics for the surface quality of substrates are becoming even more stringent. Conventional polishing compositions cannot achieve a satisfactory reduction of nanoprotrusions and surface waviness.

Therefore, the present invention provides a polishing composition for a magnetic disk substrate that can reduce nanoprotrusion defects on the surface of the substrate and surface waviness after polishing, as well as scratches, and a method for producing a magnetic disk substrate using the same.

Means for Solving Problem

The present invention relates to a polishing composition for a magnetic disk substrate, containing: a copolymer that has a constituent unit derived from a monomer having a solubility of 2 g or less in 100 g of water at 20° C. and a constituent unit having a sulfonic acid group, and has a saturated hydrocarbon chain as the main chain thereof, or a salt of the copolymer; an abrasive; and water.

Furthermore, a method for producing a magnetic disk substrate according to the present invention relates to a method for producing a magnetic disk substrate, including the step of polishing a substrate to be polished by using the polishing composition of the present invention.

Effects of the Invention

The polishing composition for a magnetic disk substrate according to the present invention preferably can achieve the effect of producing a magnetic disk substrate, in particular, a magnetic disk substrate for the perpendicular magnetic recording scheme, for which nanoprotrusion defects and substrate surface waviness after polishing, as well as scratches on the surface of the substrate after polishing, are reduced.

DESCRIPTION OF THE INVENTION

—Scratch—

As used herein, a "scratch" refers to a minute flaw having a depth of 1 nm or greater, a width of 100 nm or greater, and a length of 1000 nm or greater in a substrate surface. A "scratch" can be detected, for example, by Candela 6100 series manufactured by KLA-Tencor Corporation and NS1500 series manufactured by Hitachi High-Technologies Corporation, which are optical defect detection apparatuses, and can be quantitatively evaluated as the number of scratches. Furthermore, the size and the shape of a detected scratch can be analyzed using an atomic force microscope (AFM), a scanning electron microscope (SEM), and a transmission electron microscope (TEM).

—Nanoprotrusion Defect—

As used herein, a "nanoprotrusion defect" refers to a defect on the surface of a substrate after polishing in the manufacturing process of a magnetic disk substrate, and is an optically detectable protrusion defect having a size of about less than 10 nm. To realize a magnetic disk having a higher density and a larger capacity, it is necessary that the space between the magnetic head and the magnetic disk is less than 10 nm.

Accordingly, any remaining nanoprotrusions may result in the wearing of the magnetic head, and a decreased recording density and the instability of the magnetic disk drive. If nanoprotrusion defects can be reduced in a substrate after polishing, then it is possible to decrease the flying height of the magnetic head, thus making it possible to improve the recording density of the magnetic disk substrate.

—Waviness—

As used herein, "waviness" of the surface of a substrate refers to irregularities having a larger wavelength than roughness on the surface of the substrate. Although waviness generally includes long-wavelength waviness (having a wavelength of 0.4 to 2 mm) and short-wavelength waviness (having a wavelength of 5 to 50 μm), it herein refers to short-wavelength waviness unless otherwise stated. By reducing the waviness of the surface of the substrate after polishing, it is possible to decrease the flying height of the magnetic head, thus improving the recording density of the magnetic disk substrate.

The present invention is based on the finding that, with the use of a polishing composition containing a copolymer that has a constituent unit having a sulfonic acid group and a hydrophobic constituent unit derived from a monomer such as styrene and methyl methacrylate, it is possible to reduce nanoprotrusion defects and substrate surface waviness after polishing, in addition to reducing scratches of the substrate after polishing.

That is, the present invention relates to a polishing composition (hereinafter, also referred to as "the polishing composition of the present invention") for a magnetic disk substrate, containing: a copolymer that has a constituent unit derived from a monomer having a solubility of 2 g or less in 100 g of water at 20° C. and a constituent unit having a sulfonic acid group, and has a saturated hydrocarbon chain as the main chain thereof, or a salt of the copolymer; an abrasive; and water.

With the polishing composition of the present invention, it is possible to achieve not only the effect of reducing scratches, but also the effect of reducing nanoprotrusion defects and surface waviness in a substrate after polishing.

Although the details of the mechanism by which the polishing composition of the present invention can reduce not only scratches, but also nanoprotrusion defects and substrate surface waviness after polishing are not clear; it seems that the inclusion of a hydrophobic constituent unit in a copolymer increases the amount of the copolymer adsorbed onto a polishing pad, and thus suppresses the vibrations of the polishing pad, as a result of which scratches, nanoprotrusion defects, and substrate surface waviness after polishing are decreased. However, the present invention is not limited to this mechanism.

—Copolymer—

The polishing composition of the present invention contains a copolymer (hereinafter, also referred to as "the copolymer of the present invention") that has a constituent unit derived from a monomer having a solubility of 2 g or less in 100 g of water at 20° C. and a constituent unit having a sulfonic acid group, and has a saturated hydrocarbon chain as the main chain thereof, or a salt of the copolymer. Hereinafter, a constituent unit derived from a monomer having a solubility of 2 g or less in 100 g of water at 20° C. is also referred to as a "hydrophobic constituent unit". Note that the arrangement of the hydrophobic constituent unit and the constituent unit having a sulfonic acid group may be either random, block, or graft. As will be described below, the copolymer of the present invention also may contain constituent units other than the above-described constituent units, as long as specific content ranges are all satisfied. The copolymer of the present invention does not contain any double bond in the main chain, and therefore has the advantages of exhibiting excellent hydrolysis resistance and of having enhanced quality stability as a polishing composition, as compared with a copolymer having a double bond in the main chain.

—Hydrophobic Constituent Unit—

The hydrophobic constituent unit in the copolymer of the present invention is a constituent unit derived from a monomer (hereinafter, also referred to as a "hydrophobic monomer") having a solubility of 2 g or less in 100 g of water at 20° C. The solubility of the hydrophobic monomer in 100 g of water at 20° C. is preferably 0 to 1 g, more preferably 0 to 0.1 g, from the viewpoint of reducing scratches, nanoprotrusion defects and substrate surface waviness after polishing.

Preferable examples of the hydrophobic monomer include alkyl acrylate monomers, alkyl methacrylate monomers, polyalkylene glycol acrylate monomers excluding polyethylene glycol acrylate monomers, polyalkylene glycol methacrylate monomers excluding polyethylene glycol methacrylate monomers, styrene monomers, alkyl acrylamide monomers, and alkyl methacrylamide monomers. It is preferable that the alkyl groups contained in these monomers include not only straight or branched-chain hydrocarbon groups, but also hydrocarbon groups having a mono or polycyclic aliphatic or aromatic ring that may further have a straight or branched-chain alkyl group as a substituent.

Preferably, the constituent unit derived from a hydrophobic monomer is at least one constituent unit selected from the group consisting of constituent units represented by the following general formulae (1) and (2), from the viewpoint of improving the hydrolysis resistance, and of reducing scratches, nanoprotrusion defects and substrate surface waviness after polishing.

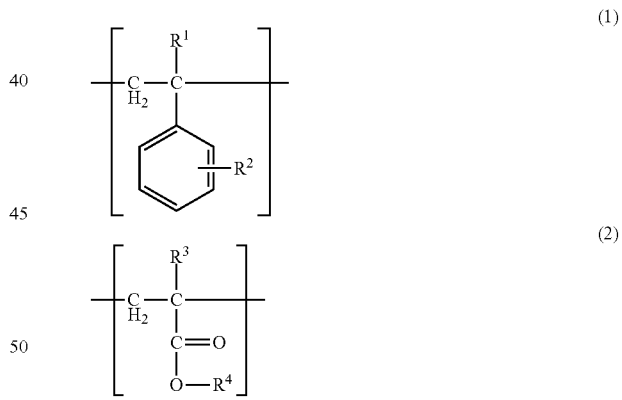

In the formulae (1) and (2), $R^1$ and $R^3$ are each preferably a hydrogen atom or an alkyl group having 1 to 4 carbon atoms, $R^2$ is preferably a hydrogen atom, a hydroxy group, an alkyl group having 1 to 4 carbon atoms, an alkoxy group having 1 to 4 carbon atoms, or an aryl group, and $R^4$ is preferably a hydrocarbon chain having 1 to 22 carbon atoms.

In the hydrophobic constituent unit represented by the general formula (1) above, $R^1$ is preferably a hydrogen atom or an alkyl group having 1 to 4 carbon atoms, more preferably a hydrogen atom or an alkyl group having 1 to 3 carbon atoms, still more preferably a hydrogen atom, a methyl group, or an ethyl group, even more preferably a hydrogen atom or a methyl group, from the viewpoint of increasing the amount of the copolymer adsorbed onto the polishing pad, and of reducing the scratches, nanoprotrusion defects and substrate surface waviness after polishing. In the general formula (1) above, $R^2$ may be one substituent present on an ortho, meta, or para position, two substituents present on the meta positions, or substituents present on other two or more positions. $R^2$ is preferably a hydrogen atom, a hydroxy group, an alkyl group having 1 to 4 carbon atoms, or an alkoxy group having 1 to 4 carbon atoms, or an or aryl group, more preferably a hydrogen atom, or one or more alkyl groups having 1 to 4 carbon atoms, still more preferably a hydrogen atom, from the viewpoint of increasing the amount of the copolymer adsorbed onto the polishing pad, and of reducing the scratches, nanoprotrusion defects and substrate surface waviness after polishing. When a plurality of $R^2$ are present, they may be the same or different. Note that the above-mentioned alkyl group having 1 to 4 carbon atoms and alkoxy group having 1 to 4 carbon atoms may have a linear configuration or a branched configuration. Further, the copolymer of the present invention may contain two or more hydrophobic constituent units represented by the general formula (1) above.

The proportion of the hydrophobic constituent unit represented by the general formula (1) above relative to all the constituent units constituting the copolymer of the present invention is preferably 5 to 95 mol %, more preferably 5 to 70 mol %, still more preferably 10 to 60 mol %, even more preferably 15 to 50 mol %, still even more preferably 20 to 40 mol %, from the viewpoint of reducing the scratches, nanoprotrusion defects, and substrate surface waviness after polishing.

Monomers that give the hydrophobic constituent unit represented by the general formula (1) include styrene, α-methyl styrene, 2-methyl styrene, 3-methyl styrene, 4-methyl styrene, α,2-dimethyl styrene, 2,4-dimethyl styrene, 2,5-dimethyl styrene, 2,4,6-trimethyl styrene, 2-ethyl styrene, 4-ethyl styrene, 4-isopropyl styrene, 2-methoxy styrene, 3-methoxy styrene, 4-methoxy styrene, 4-ethoxy styrene, 4-phenoxy styrene, 4-phenyl styrene, 2-hydroxy styrene, and 4-hydroxy styrene. Among these, styrene is preferable, from the viewpoint of the reactivity and of reducing the scratches, nanoprotrusion defects, and substrate surface waviness after polishing.

In the hydrophobic constituent unit represented by the general formula (2) above in the copolymer of the present invention, $R^3$ is preferably a hydrogen atom or an alkyl group having 1 to 4 carbon atoms, more preferably a hydrogen atom or an alkyl group having 1 to 3 carbon atoms, still more preferably a hydrogen atom, a methyl group, or an ethyl group, even more preferably a hydrogen atom or a methyl group, from the viewpoint of increasing the amount of the copolymer adsorbed onto the polishing pad, and of reducing the scratches, nanoprotrusion defects and substrate surface waviness after polishing. In the general formula (2) above, $R^4$ is preferably a hydrocarbon chain having 1 to 22 carbon atoms, and the number of carbon atoms is more preferably 1 to 18, still more preferably 1 to 12, even more preferably 1 to 8, still even more preferably 1 to 4, from the viewpoint of increasing the amount of the copolymer adsorbed onto the polishing pad, and of reducing the scratches, nanoprotrusion defects and substrate surface waviness after polishing. The hydrocarbon chain may have a linear configuration, a branched configuration, or a cyclic configuration, and is preferably an alkyl group, an alkenyl group, a phenyl group, or a cycloalkyl group, more preferably an alkyl group. Further, the copolymer of the present invention may contain two or more hydrophobic constituent units represented by the general formula (2) above.

The proportion of the hydrophobic constituent unit represented by the general formula (2) above relative to all the constituent units constituting the copolymer of the present invention is preferably 5 to 95 mol %, more preferably 30 to 95 mol %, still more preferably 40 to 90 mol %, even more preferably 50 to 85 mol %, still even more preferably 60 to 80 mol %, from the viewpoint of reducing the scratches, nanoprotrusion defects, and substrate surface waviness after polishing.

Examples of preferable hydrophobic monomers that give the hydrophobic constituent unit represented by the general formula (2) above include methyl methacrylate, ethyl methacrylate, butyl methacrylate, hexyl methacrylate, octyl methacrylate, ethylhexyl methacrylate, decyl methacrylate, lauryl methacrylate (LMA), palmityl methacrylate, cetyl methacrylate, stearyl methacrylate (SMA), isostearyl methacrylate (ISMA), behenyl methacrylate (BMA), phenyl methacrylate, benzyl methacrylate (BzMA), cyclohexyl methacrylate, methyl acrylate, ethyl acrylate, butyl acrylate, hexyl acrylate, octyl acrylate, ethylhexyl acrylate, decyl acrylate, lauryl acrylate, palmityl acrylate, cetyl acrylate, stearyl acrylate, isostearyl acrylate, behenyl acrylate, phenyl acrylate, benzyl acrylate, and cyclohexyl acrylate. Among these, methyl methacrylate and ethyl methacrylate are preferable, and methyl methacrylate is more preferable, from the viewpoint of the reactivity and of reducing the scratches, nanoprotrusion defects, and substrate surface waviness after polishing.

—Constituent Unit Having Sulfonic Acid Group—

The constituent unit having a sulfonic acid group in the copolymer of the present invention may be obtained, for example, by polymerizing monomers having a sulfonic acid group. Preferably, the constituent unit having a sulfonic acid group is represented by the following general formula (3), from the viewpoint of reducing the scratches, nanoprotrusion defects, and substrate surface waviness after polishing. In the following general formula (3), $R^5$ is preferably a hydrogen atom or an alkyl group having 1 to 4 carbon atoms, more preferably a hydrogen atom or an alkyl group having 1 to 3 carbon atoms, still more preferably a hydrogen atom, a methyl group, or an ethyl group, even more preferably a hydrogen atom or a methyl group, still even more preferably a methyl group, from the viewpoint of reducing the scratches, nanoprotrusion defects, and substrate surface waviness after polishing. From the viewpoint of the solubility and dispersibility of the copolymer, and of reducing the scratches, nanoprotrusion defects, and substrate surface waviness after polishing, $R^6$ in the following general formula (3) is an aryl group substituted with one or more sulfonic acid groups, and is preferably a phenyl group substituted with one or more sulfonic acid groups, more preferably a phenyl group having one sulfonic acid group present on an ortho, meta, or para position, or a phenyl group having two sulfonic acid groups present on the meta positions, more preferably a phenyl group having a sulfonic acid group present on the para position. The copolymer of the present invention may contain a constituent unit having two or more sulfonic acid groups. Note that these sulfonic acid groups may be in the form of a neutralized salt.

(3)

In the general formula (3), $R^5$ is preferably a hydrogen atom or an alkyl group having 1 to 4 carbon atoms, and $R^6$ is preferably an aryl group having one or more sulfonic acid groups.

There is no particular limitation with respect to the counter ion of the sulfonic acid group, and specific examples thereof include ions such as metal ions, ammonium, and alkylammoniums. Specific examples of metals include metals belonging to Group 1A, 1B, 2A, 2B, 3A, 3B, 4A, 6A, 7A or 8 in the periodic table (long period form). Among these metals, from the viewpoint of reducing surface roughness and scratches, metals belonging to Group 1A, 3B, or 8 are preferable, and sodium and potassium, which belong to Group 1A, are more preferable. Specific examples of alkylammoniums include tetramethylammonium, tetraethylammonium, and tetrabutylammonium. Among such salts, an ammonium salt, a sodium salt and a potassium salt are more preferable.

From the viewpoint of reducing the scratches, nanoprotrusion defects, and substrate surface waviness after polishing, the proportion of the constituent unit having a sulfonic acid group relative to all the constituent units constituting the copolymer of the present invention is preferably 5 to 95 mol %. When the hydrophobic constituent unit of the copolymer of the present invention is a hydrophobic constituent unit represented by the general formula (1) above, the proportion of the constituent unit having a sulfonic acid group is preferably 40 to 90 mol %, more preferably 50 to 85 mol %, still more preferably 60 to 80 mol %, from the same viewpoint. When the hydrophobic constituent unit of the copolymer of the present invention is a hydrophobic constituent unit represented by the general formula (2) above, the proportion of the constituent unit having a sulfonic acid group is preferably 5 to 70 mol %, more preferably 10 to 60 mol %, still more preferably 15 to 50 mol %, even more preferably 20 to 40 mol %, from the same viewpoint.

From the viewpoint of improving hydrolysis resistance by including a saturated hydrocarbon chain as the main chain, examples of monomers that give the constituent unit having a sulfonic acid group include 2-(meth)acrylamide-2-methylpropane sulfonic acid, styrenesulfonic acid, vinylbenzylsulfonic acid, methallylsulfonic acid, vinylsulfonic acid, allyl sulfonic acid, isoamylenesulfonic acid, naphthalenesulfonic acid, and salts thereof. Among these, from the viewpoint of the storage stability of the copolymer and of reducing the scratches, nanoprotrusion defects, and substrate surface waviness after polishing, styrenesulfonic acid, methylstyrenesulfonic acid and salts thereof are preferable, and styrenesulfonic acid and salts thereof are more preferable. Alternatively, the constituent unit having a sulfonic acid group may be obtained by sulfonating a (co)polymer (base polymer) containing the above-described hydrophobic constituent unit with a known sulfonating agent or the like.

From the viewpoint of reducing the scratches, nanoprotrusion defects, and substrate surface waviness after polishing, the total proportion of the above-described hydrophobic constituent unit and constituent unit having a sulfonic acid group relative to all the constituent units constituting the copolymer of the present invention is preferably 70 to 100 mol %, more preferably 80 to 100 mol %, still more preferably 90 to 100 mol %, even more preferably 95 to 100 mol %.

The molar ratio of the hydrophobic constituent unit to the constituent unit having a sulfonic acid group (mol % of hydrophobic constituent unit/mol % of constituent unit having a sulfonic acid group) in all the constituent unit constituting the copolymer of the present invention is preferably 5/95 to 95/5, from the viewpoint of reducing the scratches, nanoprotrusion defects, and substrate surface waviness after polishing. When the hydrophobic constituent unit of the copolymer of the present invention is a hydrophobic constituent unit represented by the general formula (1) above, the molar ratio is more preferably 10/90 to 60/40, still more preferably 15/85 to 50/50, even more preferably 20/80 to 40/60, from the same viewpoint. When the hydrophobic constituent unit of the copolymer of the present invention is a hydrophobic constituent unit represented by the general formula (2) above, the molar ratio of the constituent unit having a sulfonic acid group is more preferably 30/70 to 95/5, still more preferably 40/60 to 90/10, even more preferably 50/50 to 85/15, still even more preferably 60/40 to 80/20, from the same viewpoint.

—Other Constituent Units—

The copolymer of the present invention may have constituent units other than the above-described hydrophobic constituent unit and constituent unit having a sulfonic acid group. Other constituent units include ethylenically unsaturated carboxylic acids such as acrylic acid, methacrylic acid, itaconic acid, maleic acid, fumaric acid, and crotonic acid; hydroxy group or glycidyl group-containing ethylenic monomers such as hydroxyethyl acrylate, hydroxyethyl methacrylate, glycidyl acrylate, glycidyl methacrylate, ethylene glycol diacrylate, ethylene glycol dim ethacrylate, polyethylene glycol monoacrylate, and polyethylene glycol monomethacrylate; ethylenic amides such as acrylamide, methacrylamide, n-methylol acrylamide, n-methylol methacrylamide, and n-diacetone acrylamide; ethylenic amines such as aminoethyl acrylate, aminoethyl methacrylate, N,N-dimethylaminoethyl acrylate, N,N-dimethylaminoethyl methacrylate, N,N-diethyl aminoethyl acrylate, N,N-diethyl aminoethyl methacrylate, N,N,N-trimethylaminoethyl acrylate, and N,N,N-trimethylaminoethyl methacrylate, and salts thereof. From the viewpoint of reducing the scratches, nanoprotrusion defects, and substrate surface waviness after polishing, the proportion of the other constituent units relative to all the constituent units constituting the copolymer of the present invention is preferably 0 to 30 mol %, more preferably 0 to 20 mol %, still more preferably 0 to 10 mol %, even more preferably 0 to 5 mol %, still even more preferably substantially 0 mol %.

—Method for Producing Copolymer—

Examples of the method for producing the copolymer of the present invention include, but are not limited to, monomer copolymerization methods and methods of reacting a polymer with a sulfonating agent. Monomer copolymerization methods are preferable. As the monomer copolymerization method, it is possible to use known polymerization methods such as bulk polymerization and solution polymerization. As the polymerization solvent for obtaining the copolymer of the present invention, it is possible to use any solvents having a solubility of 10 wt % or greater in water (20° C.). Examples thereof include water, alcohol solvents, ketone solvents, and ether solvents. Examples of alcohol solvents include methanol, ethanol, n-propanol, isopropanol, n-butanol, secondary butanol, tertiary butanol, isobutanol, and diacetone alcohol. Examples of ketone solvents include acetone, methyl ethyl ketone, diethyl ketone, dipropyl ketone, methyl isobutyl ketone, methyl isopropyl ketone, and cyclohexanone. Examples of ether solvents include tetrahydrofuran, dioxane, glyme, and cellosolves. These may be used singly or as a mixture of two or more. As the polymerization initiator, a known radical initiator can be used. Examples thereof include persulfates, typically, ammonium persulfate, potassium persulfate, and sodium persulfate; hydroperoxides, typically, tert-butylhydroperoxide; dialkyl peroxides, typically, tert-butylhydroperoxide; diacyl peroxides, typically, acetyl peroxide and benzoyl peroxide; ketone peroxides, typically, methyl ethyl ketone peroxide; and azo polymerization initiators. One or more of these polymerization initiators may used. The concentration of the initiator, relative to the monomers, is preferably 1 to 100 mol %, more preferably 3 to 50 mol %, still more preferably 5 to 30 mol %. A chain transfer agent may be used as needed. The monomer concentration during polymerization is preferably 0.5 to 90 wt %, more preferably 1.0 to 50 wt %, still more preferably 3.0 to 30 wt %. The polymerization temperature is preferably 40 to 300° C., more preferably 50 to 250° C., still more preferably 60 to 200° C. When two or more monomers are copolymerized, it is preferable to perform dropwise polymerization in order to make monomer conversions over time equal. Also, the dripping rate and the dripping time are adjusted as appropriate. Here, the monomer conversion is the degree of a monomer converted into a polymer, and can be expressed by the following equation:

Monomer Conversion (%)={(Amount of Monomer Fed)−(Amount of Unreacted Monomer))/(Amount of Monomer Fed)}×100

Making the monomer conversions equal has the advantage of improving the substrate quality, since it reduces variations in the composition ratio of the resulting polymer. The ratio of conversions of two or more monomers is preferably 0.7 to 1.3, more preferably 0.8 to 1.2, still more preferably 0.9 to 1.1.

—Weight-Average Molecular Weight of Copolymer—

From the viewpoint of reducing the scratches, nanoprotrusion defects, and substrate surface waviness after polishing, the weight-average molecular weight of the copolymer of the present invention is preferably 500 or greater and 120000 or less, more preferably 1000 or greater and 100000 or less, still more preferably 1000 or greater and 30000 or less, even more preferably 1000 or greater and 10000 or less, still even more preferably 1500 or greater and 8000 or less. The weight-average molecular weight is a value measured using gel permeation chromatography (GPC) under the conditions described in Examples.

When the copolymer of the present invention at least partially forms a salt, there is no particular limitation with respect to the counter ion thereof. Examples include ions such as metal ions, ammonium, and alkylammoniums, as in the case of the above-described sulfonate salt group.

From the viewpoint of reducing the scratches, nanoprotrusion defects, and substrate surface waviness after polishing, the proportion of the copolymer of the present invention relative to the polishing composition is preferably 0.001 to 1 wt %, more preferably 0.005 to 0.5 wt %, still more preferably 0.01 to 0.2 wt %, even more preferably 0.01 to 0.1 wt %, particularly preferably 0.01 to 0.075 wt %.

—Heterocyclic Aromatic Compound—

From the viewpoint of reducing the scratches, nanoprotrusion defects, and substrate surface waviness after polishing, while maintaining the polishing rate, it is preferable that the polishing composition of the present invention contains a heterocyclic aromatic compound having two or more nitrogen atoms in the heterocycle. The heterocyclic aromatic compound has, in the heterocycle, preferably three or more nitrogen atoms, more preferably 3 to 9 nitrogen atoms, still more preferably 3 to 5 nitrogen atoms, even more preferably 3 or 4 nitrogen atoms.

From the viewpoint of reducing the scratches, nanoprotrusion defects, and substrate surface waviness after polishing, the heterocyclic aromatic compound is preferably pyrimidine, pyrazine, pyridazine, 1,2,3-triazine, 1,2,4-triazine, 1,2,5-triazine, 1,3,5-triazine, 1,2,4-oxadiazole, 1,2,5-oxadiazole, 1,3,4-oxadiazole, 1,2,5-thiadiazole, 1,3,4-thiadiazole, 3-aminopyrazole, 4-aminopyrazole, 3,5-dimethylpyrazole, pyrazole, 2-aminoimidazole, 4-aminoimidazole, 5-aminoimidazole, 2-methylimidazole, 2-ethylimidazole, imidazole, benzimidazole, 1,2,3-triazole, 4-amino-1,2,3-triazole, 5-amino-1,2,3-triazole, 1,2,4-triazole, 3-amino-1,2,4-triazole, 5-amino-1,2,4-triazole, 3-mercapto-1,2,4-triazole, 1H-tetrazole, 5-aminotetrazole, 1H-benzotriazole, 1H-tolyltriazole, 2-aminobenzotriazole, 3-aminobenzotriazole, or such compounds substituted with alkyl or such compounds substituted with amine. 1H-benzotriazole and 1H-tolyl triazole are more preferable, and 1H-benzotriazole is still more preferable. Examples of the alkyl groups of the above-described alkyl-substituted compounds include lower alkyl groups having 1 to 4 carbon atoms, and specific examples thereof include a methyl group and an ethyl group. Examples of the above-described amine-substituted compounds include 1-[N,N-bis(hydroxyethylene)aminomethyl]benzotriazole, 1-[N,N-bis(hydroxyethylene)aminomethyl]tolyl triazole.

From the viewpoint of reducing the scratches, nanoprotrusion defects, and substrate surface waviness after polishing, the proportion of the heterocyclic aromatic compound relative to the polishing composition is preferably 0.01 to 10 wt %, more preferably 0.05 to 5 wt %, still more preferably 0.1 to 1 wt %, relative to the weight of the entire polishing composition. Note that the polishing composition may contain one heterocyclic aromatic compound, or may contain two or more heterocyclic aromatic compounds.

From the viewpoint of reducing the scratches, nanoprotrusion defects, and substrate surface waviness after polishing, the concentration ratio of the abrasive and the heterocyclic aromatic compound [Concentration of Abrasive (wt %)/Concentration of Heterocyclic Aromatic Compound (wt %)] in the polishing composition is preferably 2 to 100, more preferably 5 to 50, still more preferably 10 to 25.

Further, from the viewpoint of reducing the scratches, nanoprotrusion defects, and substrate surface waviness after polishing, the concentration ratio of the heterocyclic aromatic compound and the above-described copolymer [Concentration of Heterocyclic Aromatic Compound (wt %)/Concentration of Copolymer (wt %)] in the polishing composition is preferably 1 to 100, more preferably 2 to 50, still more preferably 2.5 to 25.

—Abrasive—

As the abrasive used in the present invention, it is possible to use abrasive commonly used for polishing, and examples thereof include metals, carbides, nitrides, oxides or borides of metals or metalloids, and diamond. Metal or metalloid elements are those belonging to Group 2A, 2B, 3A, 3B, 4A, 4B, 5A, 6A, 7A or 8 in the periodic table (long period form). Specific examples of the abrasive include aluminum oxide (alumina), silicon carbide, diamond, magnesium oxide, zinc oxide, titanium oxide, cerium oxide, zirconium oxide, and silica. From the viewpoint of increasing the polishing rate, it is preferable to use one or more of these. Among these, alumina and colloidal silica are preferable from the viewpoint of reducing the scratches, nanoprotrusion defects, and substrate surface waviness after polishing. Colloidal silica is more preferable.

Colloidal silica may be obtained, for example, by a known production method in which it is produced from a silicic acid aqueous solution. In terms of operability, it is preferable that silica particles are used in the form of slurry. The present invention is based on the finding that the scratches, nanoprotrusion defects, and substrate surface waviness after polishing further can be reduced by preferably combining specific silica particles described below with the above-described copolymer.

Specifically, in a preferred aspect, the present invention is based on the finding that nanoprotrusion defects and substrate surface waviness, as well as scratches, after polishing further can be reduced by focusing on the CV value difference (ΔCV value) between two different detection angles, in addition to the average particle diameter, which has been conventionally a target of control, and combining the above-described copolymer with an abrasive that has been controlled using these two parameters.

—Average Particle Diameter of Abrasive—

Average Particle Diameter Based on Scattering Intensity Distribution Measured at Detection Angle of 90° by Dynamic Light Scattering In the present specification, two types of average particle diameters, i.e., an average particle diameter (S2) measured by observation with a transmission electron microscope, and an average particle diameter based on a scattering intensity distribution measured at a detection angle of 90° by dynamic light scattering, are used as the average particle diameters of the abrasive. Specifically, they are measured in the method described in Examples. From the viewpoint of reducing the substrate surface waviness and nanoprotrusion defects after polishing, the average particle diameter based on a scattering intensity distribution measured at a detection angle of 90° by dynamic light scattering is preferably 1 to 40 nm, more preferably 5 to 37 nm, still more preferably 10 to 35 nm. From the same viewpoint, the average particle diameter (S2) measured by observation with a transmission electron microscope is preferably 1 to 40 nm, more preferably 5 to 37 nm, still more preferably 10 to 35 nm.

—ΔCV Value of Abrasive—

As used herein, the ΔCV value of the abrasive refers to the difference (ΔCV=CV30−CV90) between the values of coefficients of variation (CVs), CV30 and CV90. CV30 is obtained by dividing a particle size standard deviation measured based on a scattering intensity distribution at a detection angle of 30° (forward scattering) by dynamic light scattering by an average particle diameter measured based on a scattering intensity distribution at a detection angle of 30° by dynamic light scattering, and multiplying the result by 100. CV90 is obtained by dividing a particle size standard deviation measured based on a scattering intensity distribution at a detection angle of 90° (side scattering) by dynamic light scattering by an average particle diameter measured based on a scattering intensity distribution at a detection angle of 90° by dynamic light scattering, and multiplying the result by 100. Specifically, they can be measured in the method described in Examples. From the viewpoint of reducing the scratches, nanoprotrusion defects, and substrate surface waviness after polishing, without impairing productivity, the ΔCV value of the abrasive used for the polishing composition of the present invention is preferably 0 to 14%, more preferably 0 to 10%, still more preferably 0.01 to 10%, even more preferably 0.01 to 7%, still even more preferably 0.01 to 5%.

—CV Value of Abrasive—

As used herein, the CV value of the colloidal silica abrasive refers to the value of a coefficient of variation obtained by dividing a standard deviation based on a scattering intensity distribution by dynamic light scattering by an average particle diameter, and multiplying the result by 100. In particular, the CV value measured at a detection angle of 90° (side scattering) is referred to as CV90, and the CV value at a detection angle of 30° (forward scattering) is referred to as CV30, as described above. Specifically, these values can be obtained by the method described in Examples. From the viewpoint of reducing the scratches, nanoprotrusion defects, and substrate surface waviness after polishing, without impairing productivity, the value of CV90 of the colloidal silica abrasive used for the polishing composition of the present invention is preferably 1 to 35%, more preferably 5 to 34%, still more preferably 10 to 33%.

The present inventors have found that there is a correlation between the value of ΔCV of an abrasive and the proportion of agglomerates (non-spherical particles) of the abrasive, and that scratches, nanoprotrusion defects, and substrate surface waviness after polishing can be reduced by using an abrasive with a ΔCV value in a specific range. Although the reason that such an effect can be achieved is not clear, it seems that controlling the ΔCV value enables reduction of abrasive agglomerates (non-spherical particles) of 50 to 200 nm generated by agglomeration of the primary particles of the abrasive, and combining the abrasive containing less such agglomerates with the copolymer of the present invention allows further suppression of the generation of the above-described agglomerates during polishing, and also reduction of frictional vibrations during polishing to prevent the abrasive agglomerates from being detached from the pores of a pad, thus further reducing nanoprotrusion defects and substrate surface waviness, as well as scratches in the substrate, after polishing. However, the present invention is not limited to these assumed mechanisms.

That is, it seems that the presence of non-spherical particles in a particle dispersion sample, which have been difficult to detect, readily can be detected by focusing on the ΔCV value, and it is therefore possible to avoid using a polishing composition containing such non-spherical particles, thereby reducing scratches.

Here, whether the particles contained in the particle dispersion sample are spherical or non-spherical is generally determined by a method in which the angular dependence of a diffusion coefficient ($D=\Gamma/q^2$) measured by dynamic scattering is used as an index (e.g., see JP H10-195152A). Specifically, the average shape of the particles contained in a dispersion is determined as being spherical if the angular dependence is small that is shown in a graph where $\Gamma/q^2$ is plotted against a scattering vector $q^2$, whereas the average shape of the particles contained in the dispersion is determined as being non-spherical if the angular dependence is large. In other words, this conventional method, in which the angular dependence of a diffusion coefficient measured by dynamic scattering is used as an index, is a method by which the shape, the particle size, and the like of particles are detected and measured assuming that homogeneous particles are dispersed throughout the system. Therefore, it is difficult to detect non-spherical particles that are present in a dispersion sample in which spherical particles are dominant.

On the other hand, dynamic light scattering, in principle, can provide substantially constant results with regard to scattering intensity distributions regardless of the detection angle, when a spherical particle dispersion solution containing particles of 200 nm or less is measured, and the measurement results therefore are not dependent on the detection angle. However, due to the presence of non-spherical particles, the scattering intensity distribution obtained by dynamic light scattering of a spherical particle dispersion solution containing non-spherical particles significantly varies depending on the detection angle; the lower the detection angle, the broader the scattering intensity distribution. Consequently, the measurement results with regard to the scattering intensity distributions obtained by dynamic light scattering are dependent on the detection angle, and it is believed that a trace amount of non-spherical particles present in a spherical particle dispersion solution can be measured by measuring a ΔCV value, which is one of the indices for the "angular dependence of a scattering intensity distribution measured by dynamic light scattering". However, the present invention is not limited to these mechanisms.

—Scattering Intensity Distribution—

As used herein, a "scattering intensity distribution" refers to a scattering intensity-based particle size distribution, which is among three types of particle size distribution (scattering intensity-based, volume-converted, number-converted) of submicron particles that are determined by dynamic light scattering (DLS) or quasielastic light scattering (QLS). Ordinarily, submicron particles undergo Brownian motion in a solvent, and the scattered light intensity thereof temporally varies (fluctuates) when the particles are irradiated with laser light. From this fluctuation of the scattered light intensity, an autocorrelation function is obtained, for example, by photon correlation (JIS Z 8826), a diffusion coefficient (D) representing the rate of the Brownian motion is then calculated by an analysis using the Cumulant method, and an average particle diameter (d: hydrodynamic diameter) can be obtained by the Einstein-Stokes equation. In addition to the polydispersity index (PI) obtained by the Cumulant method, the histogram method (Marquardt method), the inverse Laplace transform method (CONTIN method), the non-negative least square method (NNLS method) and the like may be used for the analysis of the particle size distribution.

Ordinarily, the polydispersity index (PI) obtained by the Cumulant method is widely used for the analysis of the particle size distribution by dynamic light scattering. However, in a detection method that enables detection of a trace amount of non-spherical particles present in a particle dispersion, it is preferable to obtain an average particle diameter (d50) and a standard deviation from the analysis of the particle size distribution using the histogram method (Marquardt method) or the inverse Laplace transform method (CONTIN method), calculate a CV value (coefficient of variation: a numerical value obtained by dividing the standard deviation by the average particle diameter, and multiplying the result by 100), and use the resulting angular dependence ($\Delta$CV value).

(Reference Materials)

The 12th workshop on scattering (held on Nov. 22, 2000) textbook, 1. Basic course on scattering "Dynamic light scattering" (Mitsuhiro Shibayama, the University of Tokyo)

The 20th workshop on scattering (held on Dec. 4, 2008) textbook, 5. Particle size distribution measurement of nanoparticles by dynamic light scattering (Yasuo Mori, Doshisha University)

—Angular Dependence of Scattering Intensity Distribution—

As used herein, "the angular dependence of the scattering intensity distribution of a particle dispersion" refers to the magnitude of variation of a scattering intensity distribution according to the scattered angle, when the scattering intensity distribution of the above-described particle dispersion is measured at different angles by dynamic light scattering. For example, if there is a large difference in scattering intensity distribution between a detection angle of 30° and a detection angle of 90°, then the angular dependence of the scattering intensity distribution of that particle dispersion can be regarded as large. Therefore, as used herein, the measurement of the angular dependence of a scattering intensity distribution also includes obtaining the difference ($\Delta$CV value) between measured values that are based on scattering intensity distributions measured at two different detection angles.

As the combinations of two detection angles used for the measurement of the angular dependence of the scattering intensity distribution, a combination of a forward scattering detection angle and a side or back scattering detection angle is preferable, from the viewpoint of improving the accuracy of detecting non-spherical particles. From the same viewpoint, the forward scattering detection angle is preferably 0 to 80°, more preferably 0 to 60°, still more preferably 10 to 50°, even more preferably 20 to 40°. From the same viewpoint, the side or back scattering detection angle is preferably 80 to 180°, more preferably 85 to 175°. In the present invention, angles of 30° and 90° are used as the two detection angles for obtaining the $\Delta$CV value.

Examples of the method for adjusting the $\Delta$CV value of the abrasive include the following methods, which prevent generation of abrasive agglomerates (non-spherical particles) of 50 to 200 nm during preparation of the polishing composition.

A) A method based on filtration of the polishing composition

B) A method based on the process control during production of the abrasive

In A) above, the $\Delta$CV value can be reduced, for example, by removing silica agglomerates of 50 to 200 nm by centrifugal separation or filtration through a fine filter (see JP 2006-102829A and JP 2006-136996A). Specifically, the $\Delta$CV value can be reduced by a method in which an appropriately diluted aqueous colloidal silica solution at a silica concentration of 20 wt % or less is centrifuged under the conditions determined by the Stokes equation and where 50 nm particles can be removed (e.g., 10,000 G or greater, a height of approximately 10 cm in the centrifuge tube, 2 hours or more), a method in which pressure filtration is performed using a membrane filter with a pore diameter of 0.05 μm or 0.1 μm (for example, from Advantec Toyo Kaisha, Ltd, Sumitomo 3M Limited, and Millipore), and the like.

Colloidal silica is usually obtained by 1) placing a liquid mixture (seed liquid) of less than 10 wt %, containing JIS No. 3 sodium silicate and seed particles (small-particle-size silica) into a reaction vessel and heating the mixture to 60° C. or greater; 2) adding dropwise thereto an aqueous acidic solution of active silica obtained by passing JIS No. 3 sodium silicate through a cation exchange resin and alkali (alkali metal or quaternary ammonium) to allow the growth of spherical particles, while maintaining the pH constant and 3) aging the mixture, followed by concentration by evaporation, ultrafiltration, or the like (see JP S47-001964A, JP H1-023412B, JP H4-055125B, and JP H4-055127B). However, there have been many reports suggesting that non-spherical particles also can be produced by slightly modify the steps of the same process. For example, since active silica is very unstable, a silica sol having a long and narrow shape can be produced by intentionally adding a polyvalent metal ion of Ca, Mg or the like. Further, non-spherical silica can be produced by varying the temperature of the reaction 1 vessel (a temperature above the boiling point of water causes water to evaporate, and silica is dried at the gas-liquid interface), the pH of the reaction vessel (the connection of silica particles tends to occur at a pH of 9 or less), $SiO_2/M_2O$ (M is alkali metal or quaternary ammonium) and the molar ratio (non-spherical silica is selectively produced at 30 to 60) of the reaction vessel (see JP H08-005657B, Japanese Patent No. 2803134, JP 2006-80406A, and JP 2007-153671A). Accordingly, with B) above, the $\Delta$CV value can be adjusted to be small by controlling the process in a known production process for spherical colloidal silica so as to avoid conditions where non-spherical silica is locally produced.

—Sphericity of Abrasive—

As used herein, the sphericity of an abrasive that is measured by observation with a transmission electron microscope refers to the ratio of the projected area (A1) of a single abrasive particle that is obtained with a transmission electron microscope to the area (A2) of a circle having a circumference equal to the perimeter of the above-mentioned particle, that is, a value of "A1/A2". For example, this can be obtained as an average of the values of "A1/A2" for randomly selected 50 to 100 particles of the abrasive contained in the polishing composition of the present invention. Specifically, the sphericity of the abrasive can be measured by the method described in Examples. From the viewpoint of reducing scratches and surface roughness without impairing productivity, the sphericity of the abrasive used for the polishing composition of the present invention is preferably 0.75 to 1, more preferably 0.75 to 0.95, still more preferably 0.75 to 0.85.

—Surface Roughness of Abrasive—

As used herein, the surface roughness of the abrasive refers to a value of "SA1/SA2", which is the ratio between a specific surface area (SA1) measured by a sodium titration method and a specific surface area (SA2) converted from an average particle diameter (S2) measured by observation with a transmission electron microscope. Specifically, "SA1/SA2" is measured by the method described in Examples. When a sodium titration method is applied, it is preferable that the abrasive is silica. Here, a specific surface area (SA1) measured by a sodium titration method is obtained from the amount of a sodium hydroxide solution consumed when the abrasive is titrated with the sodium hydroxide solution, and thus can be regarded as reflecting the actual surface area. Specifically, the more the undulations or wart-like projections present on the surface of the abrasive, the larger the specific surface area (SA1). On the other hand, a specific surface area (SA2) calculated from an average particle diameter (S2) measured with a transmission electron microscope is calculated assuming that the abrasive is in the form of ideal, spherical particles. Specifically, the larger the average particle diameter (S2), the smaller the specific surface area (SA2). A specific surface area represents a surface area per unit mass. Providing that the abrasive is spherical, the larger the number of wart-like projections present on the surface of the abrasive, the larger the value of the surface roughness (SA1/SA2). The smaller the number of the wart-like projections present on the surface of the abrasive (i.e., the smoother the abrasive surface), the smaller the value of (SA1/SA2), and the closer the value will be to 1.

From the viewpoint of reducing scratches and surface roughness without impairing productivity, the surface roughness (SA1/SA2) of the abrasive used for the polishing composition of the present invention is preferably 1.3 or greater, more preferably 1.3 to 2.5, still more preferably 1.3 to 2.0.

The sphericity, the surface roughness (SA1/SA2), and the average particle diameter of the abrasive can be adjusted using a known conventional production method for abrasive. Examples thereof include the production methods described in JP 2008-137822A and JP 2008-169102A, but the present invention is not limited to such methods.

Examples of the methods for adjusting the particle size distribution of the abrasive include, but are not particularly limited to, a method in which a desired particle size distribution is achieved by adding new core particles during the particle growth process at the production stage, and a method in which a desired particle size distribution is achieved by mixing two or more types of abrasive particles having different particle size distributions.

From the viewpoint of increasing the polishing rate, the proportion of the abrasive relative to the polishing composition is preferably 0.5 wt % or greater, more preferably 1 wt % or greater, still more preferably 3 wt % or greater, even more preferably 4 wt % or greater. From the viewpoint of reducing the scratches, nanoprotrusion defects, and substrate surface waviness after polishing, the proportion of the abrasive is preferably 20 wt % or less, more preferably 15 wt % or less, still more preferably 13 wt % or less, even more preferably 10 wt % or less. That is, the proportion of the abrasive is preferably 0.5 to 20 wt %, more preferably 1 to 15 wt %, still more preferably 3 to 13 wt %, even more preferably 4 to 10 wt %.

From the viewpoint of reducing the scratches, nanoprotrusion defects, and substrate surface waviness after polishing, the concentration ratio between the abrasive and the copolymer in the polishing composition [Concentration of Abrasive (wt %)/Concentration of Copolymer (wt %)] is preferably 5 to 5000, more preferably 10 to 1000, still more preferably 25 to 500.

—Water—

The polishing composition of the present invention may contain water as a medium, and distilled water, ion exchanged water, ultrapure water and the like may be used as the water. From the viewpoint of the surface cleanliness of a substrate to be polished, ion exchanged water and ultrapure water are preferable, and ultrapure water is more preferable. The water content in the polishing composition is preferably 60 to 99.4 wt %, more preferably 70 to 98.9 wt %. In addition, an organic solvent such as alcohol may be mixed within a range that does not impair the effects of the present invention.

—Acid—

Preferably, the polishing composition of the present invention contains an acid and/or a salt thereof. From the viewpoint of increasing the polishing rate, the acid used for the polishing composition of the present invention is preferably an acidic compound having a pK1 of 2 or less, preferably a compound having a pK1 of 1.5 or less, more preferably a compound having a pK1 of 1 or less, still more preferably a compound exhibiting acidity that is so strong that cannot be expressed by pK1, from the viewpoint of reducing scratches. Preferable acids include: inorganic acids such as nitric acid, sulfuric acid, sulfurous acid, persulfuric acid, hydrochloric acid, perchloric acid, phosphoric acid, phosphonic acid, phosphinic acid, pyrophosphoric acid, tripolyphosphoric acid, and amidosulfuric acid; organic phosphonic acids such as 2-aminoethylphosphonic acid, 1-hydroxyethylidene-1,1-diphosphonic acid, aminotri(methylenephosphonic acid), ethylenediaminetetra(methylenephosphonic acid), diethylenetriaminepenta(methylenephosphonic acid), ethane-1,1-diphosphonic acid, ethane-1,1,2-triphosphonic acid, ethane-1-hydroxy-1,1-diphosphonic acid, ethane-1-hydroxy-1,1,2-triphosphonic acid, ethane-1,2-dicarboxy-1,2-diphosphonic acid, methanehydroxyphosphonic acid, 2-phosphonobutane-1,2-dicarboxylic acid, 1-phosphonobutane-2,3,4-tricarboxylic acid, and α-methyl phosphonosuccinic acid; aminocarboxylic acids such as glutamic acid, picolinic acid, and aspartic acid; and carboxylic acids such as citric acid, tartaric acid, oxalic acid, nitroacetic acid, maleic acid, and oxalacetic acid. Among these, from the viewpoint of reducing scratches, inorganic acids, carboxylic acids, and organic phosphonic acids are preferable. Among inorganic acids, phosphoric acid, nitric acid, sulfuric acid, hydrochloric acid, and perchloric acid are more preferable, and phosphoric acid and sulfuric acid are still more preferable. Among carboxylic acids, citric acid, tartaric acid, and maleic acid are more preferable, and citric acid is still more preferable. Among organic phosphonic acids, 1-hydroxyethylidene-1,1-diphosphonic acid, aminotri (methylenephosphonic acid), ethylene diaminetetra(methylenephosphonic acid), and diethylenetriamine penta(methylenephosphonic acid) are more preferable, and 1-hydroxyethylidene-1,1-diphosphonic acid and aminotri (methylenephosphonic acid) are still more preferable. Although these acids and salts thereof may be used singly or as a mixture of two or more, it is preferable to use two or more of these as a mixture, from the viewpoint of increasing the polishing rate, of reducing nanoprotrusions, and of improving the cleanliness of the substrate. It is further preferable to use a mixture of two or more of acids selected from the group consisting of phosphoric acid, sulfuric acid, citric acid, and 1-hydroxyethylidene-1,1-diphosphonic acid. Here, pK1 is the logarithmic value of the reciprocal of a first acid dissociation constant (25° C.) of an organic compound or an inorganic compound. The pK1s of various compounds are described, for example, in the 4th revised edition, "Kagaku-binran (Handbook of Chemistry) (Basic) II, pp. 316-325 (ed. by The Chemical Society of Japan).

There is no particular limitation with respect to the counter ion in the case of using salts of these acids, and specific examples thereof include salts with metals, salts with ammonium, and salts with alkyl ammonium. Specific examples of the above-mentioned metals include metals belonging to Group 1A, 1B, 2A, 2B, 3A, 3B, 4A, 6A, 7A, or 8 in the periodic table (long period form). Among these, from the viewpoint of reducing scratches, salts with metals belonging to Group 1A or salts with ammonium are preferable.

From the viewpoint of increasing the polishing rate, and of reducing the scratches, nanoprotrusion defects, and substrate surface waviness after polishing, the proportion of the acid and salt thereof relative to the polishing composition is preferably 0.001 to 5 wt %, more preferably 0.01 to 4 wt %, still more preferably 0.05 to 3 wt %, even more preferably 0.1 to 2.0 wt %.

—Oxidizing Agent—

Preferably, the polishing composition of the present invention contains an oxidizing agent. From the viewpoint of increasing the polishing rate, examples of the oxidizing agents that can be used for the polishing composition of the present invention include peroxides, permanganic acid or salts thereof, chromic acid or salts thereof, peroxoacid or salts thereof, oxoacid or salts thereof, metal salts, nitric acids, and sulfuric acids.

Example of the peroxides include hydrogen peroxide, sodium peroxide, and barium peroxide, examples of permanganic acid or salts thereof include potassium permanganate, examples of chromic acid or salts thereof include metal chromate and metal dichromate, examples of peroxoacid or salts thereof include peroxodisulfuric acid, ammonium peroxodisulfate, metal peroxodisulfate, peroxophosphoric acid, peroxosulfuric acid, sodium peroxoborate, performic acid, peracetic acid, perbenzoic acid, and perphthalic acid, examples of oxoacid or salts thereof include hypochlorous acid, hypobromous acid, hypoiodous acid, chloric acid, bromic acid, iodic acid, sodium hypochlorite, and calcium hypochlorite, and example of metal salts include iron(III) chloride, iron(III) sulfate, iron(III) nitrate, iron(III) citrate, and ammonium iron (III) sulfate.

Examples of preferable oxidizing agents include hydrogen peroxide, iron(III) nitrate, peracetic acid, ammonium peroxodisulfate, iron(III) sulfate, and ammonium iron(III) sulfate. More preferable oxidizing agents include hydrogen peroxide in that it prevents metal ions from being attached to its surface, can be used for a wide variety of uses, and is inexpensive. These oxidizing agents may be used singly or as a mixture of two or more.

From the viewpoint of increasing the polishing rate, the proportion of the oxidizing agent relative to the polishing composition is preferably 0.01 wt % or greater, more preferably 0.05 wt % or greater, still more preferably 0.1 wt % or greater. From the viewpoint of reducing the scratches, nanoprotrusion defects, and substrate surface waviness after polishing, the proportion of the oxidizing agent is preferably 4 wt % or less, more preferably 2 wt % or less, still more preferably 1 wt % or less. Accordingly, in order to increase the polishing rate while maintaining the surface quality, the proportion is preferably 0.01 to 4 wt %, more preferably 0.05 to 2 wt %, still more preferably 0.1 to 1 wt %.

—Other Components—

The polishing composition of the present invention can be mixed with other components as needed. Examples of such other components include a thickener, a dispersing agent, an anticorrosion agent, a basic substance, and a surfactant. The proportion of the other optional components relative to the polishing composition is preferably 0 to 10 wt %, more preferably 0 to 5 wt %. However, the polishing composition of the present invention can exert the effect of reducing the scratches, nanoprotrusion defects, and substrate surface waviness after polishing, without containing the other components, in particular, a surfactant. Furthermore, the polishing composition of the present invention may contain alumina abrasive grains, and can be used for a rough polishing step performed before the final polishing step.

—pH of Polishing Composition—

From the viewpoint of increasing the polishing rate, the pH of the polishing composition of the present invention is preferably 4 or less, more preferably 3.5 or less, still more preferably 3 or less, even more preferably 2.5 or less. From the viewpoint of reducing surface roughness, the pH of the polishing composition is preferably 0.5 or greater, more preferably 0.8 or greater, still more preferably 1.0 or greater, even more preferably 1.2 or greater. From the viewpoint of increasing the polishing rate, the pH of the waste liquid of the polishing composition is preferably 4 or less, more preferably 3.5 or less, still more preferably 3.0 or less. From the viewpoint of reducing surface roughness, the pH of the waste liquid of the polishing composition is preferably 0.8 or greater, more preferably 1.0 or greater, still more preferably 1.2 or greater, even more preferably 1.5 or greater. Note that the pH of the waste liquid refers to the pH of the polishing waste liquid in a polishing step using the polishing composition, that is, the polishing composition immediately after being discharged from a polishing machine.

—Method for Preparing Polishing Composition—

The polishing composition of the present invention can be prepared, for example, by mixing water, an abrasive, and a copolymer, and optionally an acid and/or salt thereof, an oxidizing agent, and other components by a known method. At this time, the abrasive may be mixed in the form of concentrated slurry, or may be mixed after being diluted with water or the like. The proportions and concentrations of the components in the polishing composition of the present invention are within the above-described ranges. However, in another aspect, the polishing composition of the present invention may be prepared in the form of a concentrate.

—Method for Producing Magnetic Disk Substrate—

In another aspect, the present invention relates to a method (hereinafter, also referred to as "the production method of the present invention") for producing a magnetic disk substrate. The production method of the present invention is a method for producing a magnetic disk substrate that includes the step of polishing a substrate to be polished using the above-described polishing composition of the present invention (hereinafter, also referred to as, "the polishing step using the polishing composition of the present invention"). Accordingly, it is possible to provide a magnetic disk substrate for which nanoprotrusion defects and substrate surface waviness after polishing, as well as scratches on the surface of the substrate after polishing, are reduced. The production method of the present invention is particularly suitable for a method for producing a magnetic disk substrate for the perpendicular magnetic recording scheme. Thus, in another aspect, the production method of the present invention is a method for producing a magnetic disk substrate for the perpendicular magnetic recording scheme, and the method includes the polishing step using the polishing composition of the present invention.

Specific examples of the method for polishing a substrate to be polished using the polishing composition of the present invention include a method in which a substrate to be polished is sandwiched between platens to which a polishing pad such as an organic polymer-based polishing cloth in the form of nonwoven fabric is attached, and the substrate to be polished is polished by moving the platens and the substrate to be polished, while feeding the polishing composition of the present invention to a polishing machine.

When the polishing process of the substrate to be polished is performed in multiple steps, the polishing step using the polishing composition of the present invention is performed preferably at the second or later stage, more preferably at the final polishing step. At that time, in order to prevent the entry of the abrasive and the polishing composition that have been used in the preceding step, separate polishing machines may be used for each step. When separate polishing machines are used for each step, it is preferable to clean the substrate to be polished after each polishing step. The polishing composition of the present invention can also be used for recirculation polishing, in which a polishing liquid that has been used is reused. Note that there is no particular limitation with respect to the polishing machine, and it is possible to use any known polishing machine for polishing magnetic disk substrates.

—Polishing Pad—

There is no particular limitation with respect to the polishing pad used in the present invention, and it is possible to use a suede type, nonwoven fabric type, or polyurethane closed-cell type polishing pad, or a two-layer type polishing pad in which such polishing pads are laminated. From the viewpoint of the polishing rate, a suede type polishing pad is preferable.

From the viewpoint of reducing scratches and of the service life of the pad, the average pore diameter of the surface of the polishing pad is preferably 50 μm or less, more preferably 45 μm or less, still more preferably 40 μm or less, even more preferably 35 μm or less. From the viewpoint of the ability of the pad to retain the polishing liquid, in order to retain the polishing liquid by the pores and prevent depletion of the liquid, the average pore diameter is preferably 0.01 μm or greater, more preferably 0.1 μm or greater, still more preferably 1 μgreater, even more preferably 10 μm or greater. From the viewpoint of maintaining the polishing rate, the maximum pore diameter of the polishing pad is preferably 100 μm or less, more preferably 70 μm or less, still more preferably 60 μm or less, particularly preferably 50 μm or less.

—Polishing Load—

The polishing load in the polishing step using the polishing composition of the present invention is preferably 5.9 kPa or greater, more preferably 6.9 kPa or greater, still more preferably 7.5 kPa or greater. This can prevent reduction in the polishing rate, thus improving the productivity. Note that the polishing load in the production method of the present invention refers to the pressure applied by the platens to the polished surface of the substrate to be polished during polishing.

In the polishing step using the polishing composition of the present invention, the polishing load is preferably 20 kPa or less, more preferably 18 kPa or less, still more preferably 16 kPa or less. This can prevent scratches from occurring. Therefore, in the polishing step using the polishing composition of the present invention, the polishing load is preferably 5.9 to 20 kPa, more preferably 6.9 to 18 kPa, still more preferably 7.5 to 16 kPa. The polishing load can be adjusted by loading at least either the platens or the substrate to be polished with air pressure, a weight, or the like.

—Feeding of Polishing Composition—

From the viewpoint of reducing scratches, the feed rate of the polishing composition of the present invention in the polishing step using the polishing composition of the present invention is preferably 0.05 to 15 mL/min, more preferably 0.06 to 10 mL/min, still more preferably 0.07 to 1 mL/min, even more preferably 0.08 to 0.5 mL/min, still even more preferably 0.12 to 0.5 mL/min, per $cm^2$ of the substrate to be polished.

Examples of the method for feeding the polishing composition of the present invention to the polishing machine include a method in which the composition is continuously fed, for example, with a pump. At the time of feeding the polishing composition to the polishing machine, it is possible to adopt a method in which the polishing composition is fed as a single liquid containing all components. In addition, it is also possible to divide the polishing composition into multiple blending component liquids in consideration of the stability and the like of the polishing composition, and feed the polishing composition as two or more liquids. In the latter case, the multiple blending component liquids are mixed together, for example, in a feed pipe or on the substrate to be polished, to serve as the polishing composition of the present invention.

—Substrate to be Polished—

Examples of the material of the substrate to be polished suitably used in the present invention include metals or metalloids, such as silicon, aluminum, nickel, tungsten, copper, tantalum, and titanium, or alloys thereof, glassy substances such as glass, glassy carbon, and amorphous carbon; ceramic materials such as alumina, silicon dioxide, silicon nitride, tantalum nitride, and titanium carbide; and resins such as polyimide resin. In particular, it is preferable to use a substrate to be polished that contains a metal such as aluminum, nickel, tungsten, or copper, or an alloy containing any of such metals as its main component. A Ni—P-plated aluminum alloy substrate and aluminosilicate glass are particularly suitable. Aluminosilicate glasses include aluminosilicate glasses having a crystal structure and aluminosilicate glasses that have been subjected to chemical reinforcement treatment. The chemical reinforcement treatment may be performed after polishing.

According to the present invention, it is possible to provide a magnetic disk substrate for which substrate surface waviness and nanoprotrusion defects after polishing, as well as scratches on the surface of the substrate after polishing, are reduced, and the present invention therefore can be suitably used for polishing a magnetic disk substrate for the perpendicular magnetic recording scheme, for which a high level of surface smoothness is required.

There is no particular limitation with respect to the shape of the above-described substrate to be polished, and the substrate may have any shape having a planar portion, including, for example, a disk shape, a plate shape, a slab shape, and a prism shape, or any shape having a curved portion, including, for example, a lens. In particular, a disk-shaped substrate to be polished is preferable. For a disk-shaped substrate to be polished, the outer diameter thereof is about 2 to 95 mm, for example, and the thickness thereof is about 0.5 to 2 mm, for example —Polishing Method—

In another aspect, the present invention relates to a method for polishing a substrate to be polished that includes polishing the substrate to be polished, while keeping the above-described polishing composition in contact with the polishing pad. By using the polishing method of the present invention, a magnetic disk substrate, in particular, a magnetic disk substrate for the perpendicular magnetic recording scheme, for which the substrate surface waviness and nanoprotrusion defects after polishing, as well as scratches on the surface of the substrate after polishing, are reduced, is preferably provided. As described above, examples of the above-mentioned substrate to be polished used in the polishing method of the present invention include those used for producing a magnetic disk substrate and a substrate for a magnetic recording medium. Of these, substrates used for a magnetic disk substrate of the perpendicular magnetic recording scheme are preferable. Note that, as the specific method and conditions for polishing, those described above can be adopted.

EXAMPLES

Examples I-1 to I-16 and Comparative Examples I-1 to I-3

Styrene/styrenesulfonic acid copolymer sodium salt (St/NaSS), polystyrenesulfonic acid sodium salt (NaSS), acrylic acid/styrenesulfonic acid copolymer sodium salt (AA/NaSS), or acrylic acid/2-acrylamide-2-methylpropane sulfonic acid copolymer sodium salt (AA/AMPS) (see Table 2 below), serving as the copolymer, and the colloidal silicas shown in Table 1 below, serving as the abrasive, were used to prepare polishing compositions, and substrates to be polished were polished using these polishing compositions. Then, the scratches, nanoprotrusion defects, and substrate surface waviness of the substrates after polishing were evaluated. Note that each of the average particle diameters in Table 1 below is an average particle diameter based on a scattering intensity distribution measured at a detection angle of 90° by dynamic light scattering. The evaluation results are shown in Table 2 below. The copolymer production method, the preparation method for polishing compositions, the methods for measuring various parameters, the polishing conditions (polishing method), and the evaluation methods are as described below.

—Method for Producing Copolymer—

As the (co)polymers listed in Table 2 below, (co)polymers that had been each produced by a known solution polymerization method were used. Here, the copolymer production method used for Example I-1 is described as a typical example.

[Method for Producing Copolymers Described in Example I-1]

A 1 L four-necked flask was charged with 180 g of isopropyl alcohol (manufactured by Kishida Chemical Co., Ltd.), 370 g of ion exchanged water, 5 g of styrene (manufactured by Kishida Chemical Co., Ltd.), and 45 g of sodium styrene sulfonate (manufactured by Wako Pure Chemical Industries, Ltd.), and 7.2 g of 2,2'-azobis(2-methylpropionamidine)dihydrochloride (V-50, manufactured by Wako Pure Chemical Industries, Ltd.) was added as an initiator. Of this mixture, 101.4 g (20 wt % of the whole reaction liquid) was transferred to a 200 mL dropping funnel, and added dropwise over two hours at 83±2° C., further aged for two hours, and the solvent was thereafter removed under reduced pressure to give styrene/sodium styrene sulfonate copolymer (10/90 mol %) as white powder. The weight-average molecular weight of this copolymer was 7100.

The copolymers of Examples I-2 to I-16 and Comparative Example I-2 were polymerized in accordance with the above-described method and by changing the monomer ratios. Polystyrenesulfonic acid sodium salt (NaSS, manufactured by Tosoh Corporation) was used for Comparative Example I-1, and acrylic acid/2-acrylamide-2-methylpropane sulfonic acid copolymer sodium salt (AA/AMPS, manufactured by Toagosei Co., Ltd) was used for Comparative Example I-3. The polymerization ratio and the weight-average molecular weight of each of the (co)polymers are as shown in Table 2 below. Note that the weight-average molecular weights were measured by a gel permeation chromatography (GPC) method under the following measurement conditions.

[GPC Conditions for St/NaSS and St/Isoprenesulfonic Acid]

Column: TSKgel α-M+TSKgel α-M (manufactured by Tosoh Corporation)

Guard Column: TSKguardcolumn α (manufactured by Tosoh Corporation)

Eluent: 60 mmol/L Phosphoric Acid, 50 mmol/L LiBr/DMF

Temperature: 40° C.

Flow Rate: 1.0 mL/min

Sample Size: 3 mg/mL

Detector: RI

Standard for Calculation: Polystyrene

[GPC Conditions for NaSS]

Column: TSKgel GMPWXL+TSKgel GMPWXL (manufactured by Tosoh Corporation)

Eluent: 0.2 M phosphoric acid buffer/$CH_3CN$=7/3 (volume ratio)

Temperature: 40° C.

Flow Rate: 10 mL/min

Sample Size: 2 mg/mL

Detector: RI

Standard for Calculation: polyethylene glycol

[GPC Conditions for AA/NaSS and AA/AMPS]

Column: TSKgel G4000PWXL+TSKgel G2500PWXL (manufactured by Tosoh Corporation)

Eluent: 0.2 M phosphoric acid buffer/$CH_3CN$=9/1 (volume ratio)

Temperature: 40° C.

Flow Rate: 1.0 mL/min

Sample Size: 5 mg/mL

Detector: RI

Standard for Calculation: sodium polyacrylate

—Method for Preparing Polishing Compositions—

The colloidal silicas shown in Table 1 below, the (co)polymers shown in Table 2 below, sulfuric acid (special grade, manufactured by Wako Pure Chemical Industries, Ltd.), HEDP (1-hydroxyethylidene-1,1-diphosphonic acid, Dequest 2010, manufactured by Solutia Japan Limited), and a hydrogen peroxide solution (manufactured by ADEKA CORPORATION, concentration: 35 wt %) were added to ion exchanged water, and these ingredients were mixed to prepare polishing compositions of Examples I-1 to I-16 and Comparative Examples I-1 to I-3, which contained the colloidal silicas and copolymers shown in Table 2 below. The proportions of the colloidal silicas, sulfuric acid, HEDP, and hydrogen peroxide relative to the polishing compositions were 4.5 wt %, 0.4 wt %, 0.1 wt %, and 0.4 wt %, respectively, and proportions of the copolymers were as shown in Table 2 below.

—Method for Measuring Average Particle Diameter, CV Value, and ΔCV Value Measured by Dynamic Light Scattering of Abrasive (Colloidal Silica)—

[Average Particle Diameter and CV Value (CV90)]

The colloidal silicas shown in Table 1 below, sulfuric acid, HEDP, and a hydrogen peroxide solution were added to ion exchanged water, and these ingredients were mixed to give standard samples. The proportions of the colloidal silicas, sulfuric acid, HEDP, and hydrogen peroxide relative to the standard samples were 5 wt %, 0.4 wt %, 0.1 wt %, and 0.4 wt %, respectively. For each of the standard samples, the area in the scattering intensity distribution at a detection angle of 90° was obtained by the Cumulant method by performing 200 times of integration using a dynamic light scattering DLS-6500 manufactured by Otsuka Electronics Co., Ltd. in accordance with the instructions provided by the manufacturer. Then, the particle size for which the above-described area constitutes 50% of the total area was determined, and this was used as the average particle diameter of the colloidal silica. As for the CV value, a value obtained by dividing the standard deviation in the scattering intensity distribution measured in accordance with the above-described measurement method by the above-described average particle diameter and multiplying the result by 100 was used as the CV value (CV90).

[ΔCV Value]

The CV value (CV30) of the colloidal silica particles at a detection angle of 30° was measured in accordance with the above-described measurement method, and a value obtained by subtracting CV90 from CV30 was used as the ΔCV value. The measurement conditions for CV90 and CV30 were as follows.

(Measurement Conditions of DLS-6500)
Detection Angle: 90°
Sampling Time: 4 (μm)
Correlation Channel: 256 (ch)
Correlation Method: TI
Sampling Temperature: 26.0(° C.)
Detection Angle: 30°
Sampling Time: 10 (μm)
Correlation Channel: 1024 (ch)
Correlation Method: TI
Sampling Temperature: 26.0 (° C.)

—Method for Measuring Sphericity of Abrasive (Colloidal Silica)—

A sample containing colloidal silica was observed with a transmission electron microscope (TEM) trade name "JEM-2000FX" (80 kV, ×1 to 50000, manufactured by JEOL Ltd.) in accordance with the instructions provided by the manufacturer, and a TEM image was photographed. This photographed image was loaded onto a personal computer as image data using a scanner. The projected area (A1) of a single particle and the area (A2) of a circle having a circumference equal to the perimeter of that particle were measured using analysis software "WinROOF ver. 3.6" (commercially available from MITANI CORPORATION), and the ratio (A1/A2) of the projected area (A1) of the particle to the area (A2) determined from the perimeter of the particle was calculated as the sphericity. Note that the numerical values shown in Table 1 below were each obtained by determining the sphericity of 100 silica particles and then calculating the average value thereof.

—Method for Measuring Surface Roughness of Abrasive (Colloidal Silica)—

As described below, the specific surface area (SA1) measured by a sodium titration method and the specific surface area (SA2) converted from the average particle diameter (S2) measured by observation with a transmission electron microscope were obtained, and the ratio thereof (SA1/SA2) was calculated as the surface roughness.

[Method for Obtaining Specific Surface Area (SA1) of Colloidal Silica by Sodium Titration Method]

1) A sample containing colloidal silica corresponding to 1.5 g as $SiO_2$ is collected in a beaker, and transferred to a constant-temperature reaction vessel (25° C.), and pure water is added to increase the amount of the liquid to 90 ml. The following operations are carried out in the constant-temperature reaction vessel maintained at 25° C.

2) A 0.1 mol/L hydrochloric acid solution is added to give a pH of 3.6 to 3.7.

3) 30 g of sodium chloride is added, and the mixture is diluted with pure water to 150 ml, and stirred for 10 minutes.

4) A pH electrode is installed, and a 0.1 mol/L sodium hydroxide solution is added dropwise with stirring, to adjust the pH to 4.0.

5) The sample adjusted to a pH of 4.0 is titrated with 0.1 mol/L sodium hydroxide. Then, four or more points of the titration amount and the pH value in the pH range from 8.7 to 9.3 are recorded, and a calibration curve is plotted with the titration amount of the 0.1 mol/L sodium hydroxide solution on the X axis, and the pH value at that titration amount on the Y axis.

6) Using Equation (1) below, the amount V (ml) of the 0.1 mol/L sodium hydroxide solution per 1.5 g of $SiO_2$ that is consumed to raise the pH from 4.0 to 9.0 is determined, and the specific surface area SA1 ($m^2/g$) is determined in accordance with the following <a> to <b>.

<a> The value of SA1 is obtained using Expression (2) below. If the value is in the range of 80 to 350 $m^2/g$, then that value is used as SA1.

<b> If the value of SA1 obtained using Expression (2) below exceeds 350 $m^2/g$, then SA1 is obtained again using Expression (3), and the obtained value is used as SA1.

$$V=(A \times f \times 100 \times 1.5)/(W \times C) \quad (1)$$

$$SA1=29.0\,V-28 \quad (2)$$

$$SA1=31.8\,V-28 \quad (3)$$

Here, the meanings of the symbols in Expression (1) above are as follows:

A: a titration amount (ml) of the 0.1 mol/L sodium hydroxide solution per $SiO_2$ 1.5 g that is required to raise the pH from 4.0 to 9.0 f: a titer of the 0.1 mol/L sodium hydroxide solution

C: a $SiO_2$ concentration (%) of the sample

W: an amount (g) of the sample collected

[Method for Determining Specific Surface Area (SA2) and Average Particle Diameter (S2) by Observation with Transmission Electron Microscope]

A sample containing colloidal silica is observed using a transmission electron microscope (TEM), trade name "JEM-2000FX" (80 kV, ×1 to 50000, manufactured by JEOL Ltd.) in accordance with the instructions provided by the manufacturer, and a TEM image is photographed. The photographed image is loaded onto a personal computer as image data using a scanner, and the circle-equivalent diameter of individual silica particles using analysis software "WinROOF ver. 3.6" (commercially available from MITANI CORPORATION), and used as the particle diameter. After the particle diameters of 1000 or more silica particles are determined in this manner, the average value thereof is calculated, and used as the average particle diameter (S2) measured by observation with a transmission electron microscope. Then, the value of the thus obtained average particle diameter (S2) is substituted into Expression (4) below to give a specific surface area (SA2).

$$SA2 = 6000/(S2 \times \rho) \quad (4)$$

($\rho$: sample density)

$\rho$: 2.2 (in the case of colloidal silica)

—Polishing—

Using the polishing compositions of Examples I-1 to I-16 and Comparative Examples I-1 to I-3 prepared as described above, the substrate to be polished described below was polished under the polishing conditions described below. Then, the waviness, nanoprotrusion defects, and scratches in the polished substrate were measured in accordance with the conditions described below, and evaluation was carried out. The results are shown in Table 2 below. The data shown in Table 2 below was obtained as follows: After polishing four substrates to be polished for each of the examples and the comparative examples, both sides of each substrate to be polished were measured, and the average of the data for the four substrates (a total of eight surfaces, including both sides) was obtained.

—Substrate to be Polished—

As the substrate to be polished, a substrate resulting from subjecting a Ni—P-plated aluminum alloy substrate to rough polishing in advance with a polishing composition containing an alumina abrasive was used. In addition, this substrate to be polished had an thickness of 1.27 mm, an outer diameter of 95 mm, and an inner diameter of 25 mm, a center line average roughness Ra measured with AFM (Digital Instrument Nano-Scope IIIa Multi Mode AFM) of 1 nm, an amplitude of long-wavelength waviness (wavelength of 0.4 to 2 mm) of 2 nm, and an amplitude of short-wavelength waviness (wavelength of 5 to 50 µm) of 2 nm.

—Polishing Conditions—

Polishing test machine: "Double side 9B polisher" manufactured by SpeedFam Company Limited Polishing Pad: suede type (thickness: 0.9 mm, average pore diameter: 30 µm) manufactured by FUJIBO HOLDINGS INC.

Amount of Polishing Composition Fed: 100 mL/min (feed rate per $cm^2$ of substrate to be polished: 0.072 mL/min)

Number of Revolutions of Lower Platen: 32.5 rpm

Polishing Load: 7.9 kPa

Polishing Time: 4 min

—Method for Evaluating Nanoprotrusion Defects and Scratches—

Measurement apparatus: OSA6100, manufactured by Candela Instruments

Evaluation: Four substrates were randomly selected from the substrates placed in the polishing test machine, and each of the substrates was irradiated with laser light at 10000 rpm, and nanoprotrusion defects and scratches were measured. The total numbers of the nanoprotrusion defects and the scratches present on both sides of each of the four substrates were each divided by 8 to give the numbers of nanoprotrusion defects and scratches per substrate. The results are shown in Table 2 below as relative values, with Comparative Example I-1 taken as 100.

—Method for Evaluating Waviness—

Three substrates were randomly selected from the polished eight substrates, and measured under the following conditions. The average value of the measured values of the three substrates was calculated as the substrate short-wavelength waviness. The results are shown in Table 2 below as relative values, with Comparative Example I-1 taken as 100.

Measurement machine: ThoT model M4224 (manufactured by Thot Technologies Inc.)

Vibrometer: laser doppler vibrometer (iodine-stabilized He—Ne laser: 633 nm)

Measurement Wavelength: 5 to 50 µm (short-wavelength waviness)

Measurement Position: the surface extending from a radius of 20 mm and ending at a radius of 46 mm from the center of the substrate Number of Revolutions of Substrate: 6000 rpm Gain: 16

Filter: 10 kHz

Laser Range: 5 mm/s/V

Track Pitch: 0.01 mm

TABLE 1

|   | Average particle diameter (DLS) (nm) | CV90 (%) | $\Delta$CV (%) | Surface roughness | Sphericity |
|---|---|---|---|---|---|
| Silica a | 26 | 24.5 | 3.1 | 1.09 | 0.78 |
| Silica b | 26 | 26.9 | 5.4 | 1.09 | 0.78 |
| Silica c | 44 | 8.8 | 4.5 | 1.44 | 0.78 |
| Silica d | 26 | 23.0 | 13.1 | 1.10 | 0.80 |

TABLE 2

| | Polishing composition | | | | Evaluation result | | |
|---|---|---|---|---|---|---|---|
| | | (Co)polymer | | | Waviness | Number of nanoprotrusions | Number of scratches |
| | Abrasive Silica | Type (polymerization molar ratio) | Weight-average molecular weight | Content (%) | Relative value | Relative value | Relative value |
| Ex. I-1 | a | St/NaSS (10/90) | 7100 | 0.03 | 87 | 60 | 58 |
| Ex. I-2 | a | St/NaSS (18/82) | 7400 | 0.03 | 86 | 41 | 45 |
| Ex. I-3 | a | St/NaSS (33/67) | 7000 | 0.02 | 82 | 41 | 18 |
| Ex. I-4 | b | St/NaSS (33/67) | 7000 | 0.03 | 84 | 42 | 19 |
| Ex. I-5 | a | St/NaSS (46/54) | 5600 | 0.005 | 88 | 50 | 30 |
| Ex. I-6 | a | St/NaSS (46/54) | 5600 | 0.02 | 85 | 36 | 23 |
| Ex. I-7 | a | St/NaSS (46/54) | 5600 | 0.03 | 85 | 39 | 23 |
| Ex. I-8 | a | St/NaSS (46/54) | 5600 | 0.05 | 87 | 44 | 23 |
| Ex. I-9 | c | St/NaSS (46/54) | 5600 | 0.03 | 86 | 43 | 33 |

TABLE 2-continued

| | | Polishing composition | | | Evaluation result | | |
| --- | --- | --- | --- | --- | --- | --- | --- |
| | | (Co)polymer | | | Waviness | Number of nanoprotrusions | Number of scratches |
| | Abrasive Silica | Type (polymerization molar ratio) | Weight-average molecular weight | Content (%) | Relative value | Relative value | Relative value |
| Ex. I-10 | a | St/NaSS (46/54) | 600 | 0.02 | 88 | 62 | 60 |
| Ex. I-11 | a | St/NaSS (46/54) | 28000 | 0.02 | 90 | 40 | 25 |
| Ex. I-12 | a | St/NaSS (46/54) | 119000 | 0.02 | 93 | 65 | 40 |
| Ex. I-13 | d | St/NaSS (46/54) | 5600 | 0.02 | 95 | 80 | 70 |
| Ex. I-14 | a | St/NaSS (57/43) | 4000 | 0.02 | 87 | 38 | 25 |
| Ex. I-15 | a | St/NaSS (66/34) | 4200 | 0.02 | 88 | 36 | 29 |
| Ex. I-16 | b | St/NaSS (75/25) | 3100 | 0.02 | 88 | 50 | 40 |
| Com. Ex. I-1 | a | NaSS (100) | 25000 | 0.05 | 100 | 100 | 100 |
| Com. Ex. I-2 | a | AA/NaSS (42/58) | 85000 | 0.03 | 98 | 98 | 90 |
| Com. Ex. I-3 | b | AA/AMPS (90/10) | 2000 | 0.02 | 98 | 95 | 85 |

As shown in Table 2 above, with the use of the polishing compositions of Examples I-1 to I-16, the waviness and the nanoprotrusions on the surface of the substrate, as well as scratches in the substrates after polishing, could be reduced as compared with Comparative Examples I-1 to I-3. Furthermore, a comparison between Example I-6 and Example I-13 showed that using the abrasive having a ΔCV value of 10 or less could further reduce scratches, waviness, and nanoprotrusion in the substrates after polishing.

Examples I-17 to I-24 and Comparative Examples I-4 to I-6

Polishing of Glass Substrate

Using the polishing composition of Examples I-17 to I-24 and Comparative Examples I-4 to I-6 prepared as below, a glass substrate was polished under the following polishing conditions. The nanoprotrusion defects and waviness were evaluated by the following methods. The results are shown in Table 3 below. The data shown in Table 3 below was obtained as follows: After polishing ten substrates to be polished for each of the examples and the comparative examples, four substrates were randomly selected, both sides of each substrate to be polished were measured, and the average of the data obtained for a total of eight surfaces, including both sides, was obtained.

—Method for Preparing Polishing Compositions—

The colloidal silica a (Table 1), the (co)polymers shown in Table 3 below, sulfuric acid (special grade, manufactured by Wako Pure Chemical Industries, Ltd.), and HEDP (1-hydroxyethylidene-1,1-diphosphonic acid, Dequest 2010, manufactured by Thermphos Japan Ltd.) were added to ion exchanged water, and these ingredients were mixed to give the polishing compositions of Examples I-17 to I-24 and Comparative Examples I-4 to I-6. The proportions of the colloidal silica, sulfuric acid, and HEDP relative to the polishing compositions were 8.0 wt %, 0.4 wt %, and 0.13 wt %, respectively, and the proportions of the copolymers were as shown in Table 3 below.

The copolymer of Example I-17 was produced in the same manner as the copolymer of Example I-1, and the copolymers of Examples I-18 to I-24 were polymerized in accordance with the above-described method and by changing the monomer ratios. Polystyrenesulfonic acid sodium salt (NaSS, manufactured by Tosoh Corporation) was used for Comparative Example I-4, and acrylic acid/2-acrylamide-2-methyl-propane sulfonic acid copolymer sodium salt (AA/AMPS, manufactured by Toagosei Co., Ltd.) was used for Comparative Example I-5. The polymerization ratio and the weight-average molecular weight of each of the (co)polymers are as shown in Table 3 below. Note that the weight-average molecular weights were measured by a gel permeation chromatography (GPC) method under the measurement conditions described below. For Comparative Example I-6, sodium lauryl sulfate (EMAL 0, manufactured by Kao Corporation) was used in place of the copolymer.

—Glass Substrate—

As the glass substrate, an aluminosilicate glass substrate that had been subjected in advance to rough polishing with a polishing liquid containing ceria abrasive grains was used. Note that this glass substrate has a thickness of 0.635 mm, an outer diameter of 65 mm, an inner diameter of 20 mm, and a center line average roughness Ra measured with AFM (Digital Instrument NanoScope IIIa Multi Mode AFM) of 3 nm.

—Polishing Conditions—

Polishing Test Machine: "Double side 9B polisher" manufactured by SpeedFam Company Limited Polishing Pad: suede type (thickness: 0.9 mm, average pore diameter: 30 μm)

Amount of Polishing Composition Fed: 100 mL/min (feed rate per $cm^2$ of substrate to be polished: about 0.3 mL/min)

Number of Revolutions of Lower Platen: 32.5 rpm

Polishing load: 8.4 kPa

—Method for Evaluating Nanoprotrusion Defects—

Evaluation of nanoprotrusion defects was carried out in the same manner as the above-described method. Note that the values in Table 3 are relative values, with Comparative Example I-4 taken as 100.

—Method for Evaluating Waviness—

The polishing times were set so that the weight reduced by polishing was 17 mg or greater, or 17 mg or less. The waviness of the polished substrates was measured under the conditions described below, and the values of waviness per unit time of polishing were obtained. The value of waviness when the weight was reduced by 17 mg was determined by interpolation of these values. The waviness measurement was carried out for three substrates for each of the polishing times, and the average value was calculated as the substrate waviness. The results are shown in Table 3 below as relative values, with Comparative Example I-4 taken as 100.

Measurement Instrument: New View 5032 (manufactured by Zygo Corporation)

Lens: 2.5×

Zoom: 0.5×

Measurement Wavelength: 159 to 500 µm (medium-wavelength waviness)

Measurement Position: within a radius of 27 mm from the center of the substrate

Analysis Software: Zygo Metro Pro (manufactured by Zygo Corporation)

TABLE 3

| | (Co)polymer | | | Waviness | Number of |
| | Type (polymerization molar ratio) | Weight-average molecular weight | Content (%) | Relative value | nanoprotrusions Relative value |
| --- | --- | --- | --- | --- | --- |
| Ex. I-17 | St/NaSS (10/90) | 7100 | 0.01 | 91 | 73 |
| Ex. I-18 | St/NaSS (18/82) | 7400 | 0.01 | 90 | 65 |
| Ex. I-19 | St/NaSS (33/67) | 7000 | 0.01 | 86 | 60 |
| Ex. I-20 | St/NaSS (33/67) | 7000 | 0.03 | 89 | 63 |
| Ex. I-21 | St/NaSS (33/67) | 7000 | 0.08 | 88 | 67 |
| Ex. I-22 | St/NaSS (33/67) | 7000 | 0.12 | 89 | 69 |
| Ex. I-23 | St/NaSS (46/54) | 5600 | 0.01 | 91 | 67 |
| Ex. I-24 | St/NaSS (66/34) | 4200 | 0.01 | 92 | 73 |
| Com. Ex. I-4 | NaSS (100) | 10000 | 0.01 | 100 | 100 |
| Com. Ex. I-5 | AA/AMPS (90/10) | 2000 | 0.01 | 99 | 85 |
| Com. Ex. I-6 | Sodium lauryl sulfate | — | 0.01 | 97 | 121 |

As shown in Table 3 above, with the use of the polishing compositions of Examples I-17 to I-24, the waviness and the nanoprotrusions on the surface of the substrate after polishing could be reduced as compared with Comparative Examples I-4 to I-6.

Examples II-1 to II-7 and Comparative Examples II-1 to II-3

Methyl methacrylate/styrenesulfonic acid copolymer sodium salt (MMA/NaSS), polystyrenesulfonic acid sodium salt (NaSS), acrylic acid/styrenesulfonic acid copolymer sodium salt (AA/NaSS), or acrylic acid/2-acrylamide-2-methylpropane sulfonic acid copolymer sodium salt (AA/AMPS), serving as the copolymer, and colloidal silica a' to c' shown in Table 4 below, serving as the abrasive, are used to prepare polishing compositions, and substrates to be polished were polished. Then, the waviness, scratches, and nanoprotrusion defects of the polished substrates after polishing were evaluated. Note that each of the average particle diameters of the colloidal silicas in Table 4 below is an average particle diameter based on a scattering intensity distribution measured at a detection angle of 90° by dynamic light scattering. The evaluation results are shown in Table 5 below. The Ni—P-plated aluminum alloy substrate serving as the substrate to be polished, the copolymer production method, the preparation method for polishing compositions, the methods for measuring various parameters, the polishing conditions (polishing method), and the evaluation methods are as described above and below.

TABLE 4

| | Average particle diameter (DLS) (nm) | CV90 (%) | ΔCV (%) | Surface roughness | Sphericity |
| --- | --- | --- | --- | --- | --- |
| Silica a' | 26.1 | 24.5 | 3.09 | 1.09 | 0.78 |
| Silica b' | 26.0 | 26.9 | 5.36 | 1.09 | 0.78 |
| Silica c' | 44.3 | 8.8 | 4.5 | 1.44 | 0.78 |

—Method for Producing Copolymers—

As the (co)polymers shown in Table 5 below, (co)polymers produced by a known solution polymerization method were used. Here, the copolymer production method used for Example II-1 is described as a typical example.

[Method for Producing Copolymers Described in Example II-1]

A 1 L four-necked flask was charged with 225 g of isopropyl alcohol (manufactured by Kishida Chemical Co., Ltd.), 225 g of ion exchanged water, 15 g of methyl methacrylate (manufactured by Wako Pure Chemical Industries, Ltd.), and 35 g of sodium styrene sulfonate (manufactured by Wako Pure Chemical Industries, Ltd.), and 8.3 g of 2,2'-azobis(2-methylpropionamidine)dihydrochloride (V-50, manufactured by Wako Pure Chemical Industries, Ltd.) was added as an initiator. Of this mixture, 101.6 g (20 wt % of the whole reaction liquid) was transferred to a 200 mL dropping funnel, and added dropwise over two hours at 83±2° C., further aged for two hours, and the solvent was thereafter removed under reduced pressure to give methyl methacrylate/sodium styrene sulfonate copolymer (50/50 mol %) as white powder. The weight-average molecular weight of this copolymer was 15000.

The copolymers of Examples II-2 to II-7 and Comparative Example II-2 were polymerized in accordance with the above-described method and by changing the monomer ratios. Polystyrenesulfonic acid sodium salt (NaSS, manufactured by Tosoh Corporation) was used for Comparative Example II-1, and acrylic acid/2-acrylamide-2-methylpropane sulfonic acid copolymer sodium salt (AA/AMPS, manufactured by Toagosei Co., Ltd.) was used for Comparative Example II-3. The polymerization ratio and the weight-average molecular weight of each of the (co)polymers are as shown in Table 5 below. Note that the weight-average molecular weights were measured by a gel permeation chromatography (GPC) method under the measurement conditions described above and below.

[GPC Conditions for MMA/NaSS]

Column: TSKgel α-M+TSKgel α-M (manufactured by Tosoh Corporation)

Guard Column: TSKguardcolumn α (manufactured by Tosoh Corporation)

Eluent: 60 mmol/L phosphoric acid, 50 mmol/L LiBr/DMF

Temperature: 40° C.

Flow Rate: 1.0 mL/min

Sample Size: 3 mg/mL

Detector: RI
Standard for Calculation: polystyrene

—Method for Preparing Polishing Compositions—

The colloidal silicas a' to c' shown in Table 4 above, the above-described (co)polymers, sulfuric acid (special grade, manufactured by Wako Pure Chemical Industries, Ltd.), HEDP (1-hydroxyethylidene-1,1-diphosphonic acid, Dequest 2010, manufactured by Thermphos Japan Ltd.), and a hydrogen peroxide solution (manufactured by ADEKA CORPORATION, concentration: 35 wt %) were added to ion exchanged water, and these ingredients were mixed to prepare polishing compositions of Examples II-1 to II-7 and Comparative Examples II-1 to II-3, which contained the colloidal silicas and copolymer shown in Table 4 above. The proportions of colloidal silicas, sulfuric acid, HEDP, and hydrogen peroxide relative to the polishing compositions were 4.5 wt %, 0.4 wt %, 0.1 wt %, and 0.4 wt %, respectively, and the proportions of the copolymers were as shown in Table 5 below.

—Polishing—

Using the polishing compositions of Examples II-1 to II-7 and Comparative Examples II-1 to II-3 prepared as described above, a Ni—P-plated aluminum alloy substrate serving as the substrate to be polished described below was polished under the same polishing conditions as described above. Then, the waviness, nanoprotrusion defects, and scratches in the polished substrate were measured in accordance with the conditions described below, and evaluation was carried out. The results are shown in Table 5 below. The data shown in Table 5 below was obtained as follows: After polishing four substrates to be polished for each of the examples and the comparative examples, both sides of each substrate to be polished were measured, and the average of the data for the four substrates (a total of eight surfaces, including both sides) was obtained. In addition, the numbers of the nanoprotrusion defects and the scratches, and the short-wavelength waviness shown in Table 5 below are shown as relative values, with Comparative Example II-1 taken as 100.

As shown in Table 5 above, with the use of the polishing compositions of Examples II-1 to II-7, the waviness and the nanoprotrusions on the substrate surface, as well as scratches in the substrates after polishing, could be reduced as compared with Comparative Examples II-1 to II-3.

Example II-8 and Comparative Examples II-4 to II-5

Polishing of Glass Substrate

Using the polishing composition of Example II-8 and Comparative Examples II-4 to II-5 prepared as below, the above-described glass substrate serving as a substrate to be polished was polished under the above-described glass substrate polishing conditions. The nanoprotrusion defects and waviness were evaluated by the same method as in Example I-17, etc. The results are shown in Table 6 below. The data shown in Table 6 below was obtained as follows: After polishing ten substrates to be polished for each of the examples and the comparative examples, four substrates were randomly selected, both sides of each substrate to be polished were measured, and the average of the data obtained for a total of eight surfaces, including both sides, was obtained.

—Method for Preparing Polishing Compositions—

The colloidal silica a' (Table 5 above), the (co)polymers shown in Table 6 below, sulfuric acid (special grade, manufactured by Wako Pure Chemical Industries, Ltd.), and HEDP (1-hydroxyethylidene-1,1-diphosphonic acid, Dequest 2010, manufactured by Thermphos Japan Ltd.) were added to ion exchanged water, and these ingredients were mixed to give the polishing compositions of Example II-8 and Comparative Examples II-4 to II-5. The proportions of the colloidal silica, sulfuric acid, and HEDP relative to the polishing compositions were 8.0 wt %, 0.4 wt %, and 0.13 wt %, respectively, and the proportions of the copolymers were as shown in Table 6 below.

The copolymer of Example II-8 was produced in the same manner as the copolymer of Example II-1. Polystyrene-

TABLE 5

| | Polishing composition | | | | Evaluation result | | |
|---|---|---|---|---|---|---|---|
| | | (Co)polymer | | | | | |
| | Abrasive Silica | Type (polymerization molar ratio) | Weight-average molecular weight | Content (wt %) | Waviness Relative value | Number of nanoprotrusions Relative value | Number of scratches Relative value |
| Ex. II-1 | a' | MMA/NaSS (70/30) | 15000 | 0.02 | 85 | 44 | 24 |
| Ex. II-2 | a' | MMA/NaSS (70/30) | 15000 | 0.05 | 84 | 41 | 23 |
| Ex. II-3 | b' | MMA/NaSS (70/30) | 15000 | 0.02 | 83 | 40 | 22 |
| Ex. II-4 | c' | MMA/NaSS (70/30) | 15000 | 0.02 | 84 | 45 | 28 |
| Ex. II-5 | a' | MMA/NaSS (43/57) | 14000 | 0.02 | 86 | 45 | 33 |
| Ex. II-6 | a' | MMA/NaSS (43/57) | 14000 | 0.05 | 83 | 42 | 30 |
| Ex. II-7 | a' | MMA/NaSS (70/30) | 2600 | 0.05 | 90 | 57 | 38 |
| Com. Ex. II-1 | a' | NaSS (100) | 25000 | 0.05 | 100 | 100 | 100 |
| Com. Ex. II-2 | a' | AA/NaSS (42/58) | 85000 | 0.03 | 98 | 98 | 90 |
| Com. Ex. II-3 | b' | AA/AMPS (90/10) | 2000 | 0.02 | 98 | 95 | 85 | sulfonic acid sodium salt (NaSS, manufactured by Tosoh Corporation) was used for Comparative Example II-4, and acrylic acid/2-acrylamide-2-methylpropane sulfonic acid copolymer sodium salt (AA/AMPS, manufactured by Toagosei Co., Ltd.) was used for Comparative Example II-5. The polymerization ratio and the weight-average molecular weight of each of the (co)polymers are as shown in Table 6 below. Note that the weight-average molecular weights were measured by a gel permeation chromatography (GPC) method under the measurement conditions described below.

TABLE 6

| | (Co)polymer | | | Waviness Relative value | Number of nanoprotrusions Relative value |
|---|---|---|---|---|---|
| | Type (polymerization molar ratio) | Weight-average molecular weight | Content (%) | | |
| Ex. II-8 | MMA/NaSS (70/30) | 15000 | 0.01 | 91 | 69 |
| Com. Ex. II-4 | NaSS (100) | 10000 | 0.01 | 100 | 100 |
| Com. Ex. II-5 | AA/AMPS (90/10) | 2000 | 0.01 | 99 | 85 |

As shown in Table 6 above, with the use of the polishing composition of Example II-8, the waviness and the nanoprotrusions on the surface of the substrate after polishing could be reduced as compared with Comparative Examples II-4 and II-5.

Examples III-1 to III-5 and Comparative Example III-1

The polishing compositions of Examples III-1 to III-5 and Comparative Example III-1 were prepared as described below, and substrates to be polished were polished. Then, the scratches and the nanoprotrusion defects in the substrates after polishing were evaluated. The evaluation results are shown in Table 8 below. The polymers used, the preparation method for polishing compositions, the methods for measuring various parameters, the polishing conditions (polishing method), and the evaluation methods are as described below.

—Copolymers—

The copolymers used for the polishing compositions were as follows. The copolymers and the weight-average molecular weights thereof are shown in Table 7 below. Note that the weight-average molecular weights of these copolymers were measured by a gel permeation chromatography (GPC) method under the measurement conditions described above.

styrene/styrenesulfonic acid copolymer sodium salt (St/NaSS, molar ratio 60/40, molecular weight 4000, synthesized by the method described below);

styrene/styrenesulfonic acid copolymer sodium salt (St/NaSS, molar ratio 50/50, molecular weight 5600, synthesized by the method described below);

styrene/styrenesulfonic acid copolymer sodium salt (St/NaSS, molar ratio 50/50, molecular weight 28000, synthesized by the method described below);

styrene/styrenesulfonic acid copolymer sodium salt (St/NaSS, molar ratio 30/70, molecular weight 7000, synthesized by the method described below)

[Method for Producing Styrene/Styrenesulfonic Acid Copolymer Sodium Salt]

A 1 L four-necked flask was charged with 180 g of isopropyl alcohol (manufactured by Kishida Chemical Co., Ltd.), 270 g of ion exchanged water, 10 g of styrene (manufactured by Kishida Chemical Co., Ltd.), and 40 g of sodium styrene sulfonate (manufactured by Wako Pure Chemical Industries, Ltd.), and 7.2 g of 2,2'-azobis(2-methylpropionamidine)dihydrochloride (V-50, manufactured by Wako Pure Chemical Industries, Ltd.) was added as an initiator. Of this mixture, 101.4 g (20 wt % of the whole reaction liquid) was transferred to a 200 mL dropping funnel, and added dropwise over two hours at 83±2° C., further aged for two hours, and the solvent was thereafter removed under reduced pressure to give a polymer (St/NaSS copolymer, molar ratio 30/70, molecular weight 7000) as white powder. The other St/NaSS copolymers were polymerized by the above-described method by changing the monomer species and the monomer ratios.

—Method for Preparing Polishing Compositions—

A heterocyclic aromatic compound (1H-benzotriazole), polymers (Table 8), colloidal silicas (silica a" to c", all manufactured by JGC Catalysts and Chemicals Ltd., Table 7), HEDP (1-hydroxyethylidene-1,1-diphosphonic acid, Dequest 2010, manufactured by Thermphos Japan Ltd.), a hydrogen peroxide solution (oxidizing agent), and the like were added in the following makeup to ion exchanged water, and these ingredients were mixed to give the polishing compositions of Examples III-1 to III-5 and Comparative Example III-1. Specifically, the polishing compositions were prepared so that the concentrations of the components therein were as follows.

Examples III-1 to III-5: heterocyclic aromatic compounds (1H-benzotriazole, concentrations: as shown in Table 8), 0.05 wt % polymer, 5 wt % silica particles, 0.5 wt % sulfuric acid, 0.1 wt % HEDP, 0.5 wt % hydrogen peroxide (pH 1.4 to 1.5);

Comparative Example III-1: heterocyclic aromatic compound (1H-benzotriazole, concentration: as shown in Table 8), 5 wt % silica particles, 2 wt % orthophosphoric acid, 0.8 wt % $K_2HPO_4$, 0.62 wt % hydrogen peroxide (pH 2)

Note that the values of physical properties (the average particle diameter measured by dynamic light scattering (DLS), the values of CV90 and ΔCV, the specific surface areas SA1 and SA2, and the average particle diameter S2, the surface roughness, and the sphericity) of silica a" used were measured by the above-described methods, and the results are shown in Table 7 below.

—Polishing—

Using the polishing compositions of Examples III-1 to III-5 and Comparative Example III-1 prepared as described above, a Ni—P-plated aluminum alloy substrate (the same as described above) serving as the substrate to be polished was polished under the same polishing conditions as described above. Then, the nanoprotrusion defects and scratches of the polished substrate were measured in accordance with the same conditions as described above, and evaluation was carried out. Note that the polishing rate was measured by the method described below. The results are shown in Table 8 below. The data shown in Table 8 below was obtained as follows: After polishing four substrates to be polished for each of the examples and the comparative examples, both sides of each substrate to be polished were measured, and the average of the data for the four substrates (a total of eight surfaces, including both sides) was obtained.

—Method for Measuring Polishing Rate—

The weight of each of the substrates was measured using a weighing instrument ("BP-210S", manufactured by Sartorius) before and after polishing, and a change in weight was determined for each substrate. An average value of 10 substrates was taken as the amount reduced, and a value obtained by dividing the amount reduced by the polishing time was taken as the rate of weight reduction. The rate of weight reduction was introduced in the following equation, and converted to a polishing rate (μm/min).

Polishing rate (μm/min)=Rate of weight reduction (g/min)/Area of one side of substrate (mm$^2$)/ Ni—P plating density (g/cm$^3$)×10$^6$ (calculated taking the area of one side of the substrate as 6597 mm$^2$, and the Ni—P plating density as 7.99 g/cm$^3$)

TABLE 7

| | Average particle diameter (DLS) (nm) | CV90 (%) | ΔCV (%) | Specific surface area SA1 (m$^2$/g) | Average particle diameter S2 (nm) | Specific surface area SA2 (m$^2$/g) | Surface roughness (SA1/SA2) | Sphericity |
|---|---|---|---|---|---|---|---|---|
| Silica a" | 28 | 19 | 4.5 | 175 | 23 | 119 | 1.5 | 0.80 |

TABLE 8

| | | Polishing composition | | | | Polishing properties | | |
|---|---|---|---|---|---|---|---|---|
| | | Copolymer | | | Heterocyclic aromatic compound 1H-Benzotriazole (wt %) | | | |
| | Abrasive Silica | Type (polymerization molar ratio) | Weight-average molecular weight | Content (%) | | Polishing rate (μm/min) | Scratches (Relative value) | Nanoprotrusions (Relative value) |
| Ex. III-1 | a" | St/NaSS (60/40) | 4000 | 0.05 | 0.2 | 0.07 | 19 | 40 |
| Ex. III-2 | a" | St/NaSS (50/50) | 5600 | 0.05 | 0.2 | 0.08 | 17 | 28 |
| Ex. III-3 | a" | St/NaSS (50/50) | 28000 | 0.05 | 0.2 | 0.07 | 17 | 33 |
| Ex. III-4 | a" | St/NaSS (30/70) | 7000 | 0.05 | 0.2 | 0.08 | 14 | 24 |
| Ex. III-5 | a" | St/NaSS (30/70) | 7000 | 0.05 | — | 0.08 | 30 | 48 |
| Com. Ex. III-1 | a" | — | — | — | 0.1 | 0.07 | 100 | 100 |

As shown in Table 8 above, with the use of the polishing compositions of Examples III-1 to III-4, the nanoprotrusions on the substrate surface, as well as scratches in the substrates after polishing, could be reduced as compared with Example III-5 and Comparative Example III-1.

Examples IV-1 to IV-2 and Comparative Example IV-1

Method for Evaluating Storage Test

In a 300 cc plastic container, 3 g of sulfuric acid, 3 g of hydrogen peroxide, 0.5 g of copolymers, and 93.5 g ion exchanged water were mixed to prepare polishing compositions, and stored at 80° C. for one week. The weight-average molecular weights were measured before and after storage, and substrates to be polished were polished using the polishing compositions.

The above-described copolymer of Example I-3 was used as Example IV-1, the above-described copolymer of Example II-5 was used as Example IV-2, CS 1106 (styrene/isoprenesulfonic acid Na copolymer, manufactured by JSR Corporation) having a double bond in the main chain was used as Comparative Example IV-1. The substrates to be polished and the polishing conditions were the same as in Example I-3 above. The method for measuring the molecular weight and the methods for measuring the numbers of scratches and nanoprotrusions were the same as those described above. The results of the molecular weight measurements and the numbers of scratches and nanoprotrusion after polishing are shown in Table 9 below as relative values, with the values before storage taken as 100.

TABLE 9

| | Copolymer (polymerization molar ratio) | | Mw | Scratches vs. before storage | Number of nanoprotrusions vs. before storage |
|---|---|---|---|---|---|
| Ex. IV-1 | St/NaSS (33/67) | Before storage | 7000 | 100 | 100 |
| | | After storage | 6900 | 100 | 100 |
| Ex. IV-2 | MMA/NaSS (43/57) | Before storage | 14000 | 100 | 100 |

TABLE 9-continued

| | Copolymer (polymerization molar ratio) | | Mw | Scratches vs. before storage | Number of nanoprotrusions vs. before storage |
|---|---|---|---|---|---|
| | | After storage | 13000 | 104 | 105 |
| Com. Ex. IV-1 | St/Isoprene sulfonic acid copolymer | Before storage | 11000 | 100 | 100 |
| | | After storage | 1200 | 133 | 116 |

As shown in Table 9 above, Examples IV-1 and IV-2 showed almost no reduction in the molecular weights of the copolymers after polishing, and exhibited good polishing results. On the other hand, Comparative Example IV-1, for which a copolymer having a double bond in the main chain was used, showed a reduction in the molecular weight of the copolymer after polishing, and showed an increase in both the number of scratches and the number of nanoprotrusion defect in the polishing test after storage.

Production Examples 1 and 2

Evaluation of Conversions of Monomers

The amounts of unreacted styrene or styrenesulfonic acid Na at different reaction times were measured under the conditions described below. The conversion of styrenesulfonic acid Na over time is taken as Css, and the conversion of styrene is taken as Cst. When the ratio (Css/Cst) of the conversion of styrenesulfonic acid Na to the conversion of styrene (Cst) is 1.0, this indicates the conversions are the same. When the ratio is larger than 1.0, this indicates that the conversion of styrenesulfonic acid Na is higher than the conversion of styrene. On the other hand, when the ratio is smaller than 1.0, this indicates that the conversion of styrene is higher than the conversion of styrenesulfonic acid Na. Css/Cst of the copolymers produced in Production Examples 1 and 2 below and the results of polishing evaluation thereof are shown in Table 10.

—Method for Quantifying Unreacted Styrene—

400 mg of each polymer was collected in a 10 ml volumetric flask, and the volume was increased with methyl acetate. After filtration with a 0.45 μm PTFE filter, the amount of unreacted styrene was calculated under the following GC conditions.

—GC Conditions—

Column: HP-FFAP, size: 30 m×0.530 mm, 1.00 μm (manufactured by Agilent Technologies)
Flow Rate of Column: 10 mL/min
Detector: FID
Inlet Temperature: 220° C.
Sample Size: 40 mg/mL
Oven Temperature: 35° C. (10 min) to 10° C./min to 220° C.

—Method for Quantifying Unreacted Styrenesulfonic Acid Na—

40 mg of each polymer was collected in a 10 ml volumetric flask, and the volume was made up with a 0.2 M phosphoric acid buffer. Thereafter, the amount of unreacted styrenesulfonic acid Na was calculated under the following HPLC conditions.

—HPLC Conditions—

Column: Lichro CART 250-4.0 RP-18 (5 μm), manufactured by Merck
Flow Rate of Column: 10 mL/min
Detector: UV 210 nm
Sample Size: 4.0 mg/mL
Eluent: 0.2 M phosphoric acid buffer/methanol=60/40 vol %

Production Example 1

A 1 L four-necked flask was charged with 91 g of isopropyl alcohol (manufactured by Kishida Chemical Co., Ltd.), 137 g of ion exchanged water, 10 g of styrene (manufactured by Kishida Chemical Co., Ltd.), and 40 g of sodium styrene sulfonate (manufactured by Wako Pure Chemical Industries, Ltd.), and the temperature was raised to 83±2° C. After introducing 6.6 g of ammonium persulfate (manufactured by Wako Pure Chemical Industries, Ltd.) as an initiator, the mixture was polymerized for two hours, and further aged for two hours. Thereafter, the solvent was removed under reduced pressure to give styrene/sodium styrene sulfonate copolymer (33/67 mol %). The weight-average molecular weight of this copolymer was 16000.

Production Example 2

A 1 L four-necked flask was charged with 230 g of isopropyl alcohol (manufactured by Kishida Chemical Co., Ltd.), 345 g of ion exchanged water, 10 g of styrene (manufactured by Kishida Chemical Co., Ltd.), and 40 g of sodium styrene sulfonate (manufactured by Wako Pure Chemical Industries, Ltd.), and 6.6 g of ammonium persulfate (manufactured by Wako Pure Chemical Industries, Ltd.) was added as an initiator. Of this mixture, 189.4 g (30 wt % of the whole reaction liquid) was transferred to a 200 mL dropping funnel, and added dropwise over six hours at 65±5° C., further aged for two hours, and the solvent was thereafter removed under reduced pressure to give styrene/sodium styrene sulfonate copolymer (33/67 mol %). The weight-average molecular weight of this copolymer was 11000.

Polishing tests were carried out using the copolymers of Production Examples 1 and 2. The results are shown in Table 10. The makeup of the polishing composition was the same as that of Example I-3 above, and silica a described above was used for the abrasive. The substrates to be polished and the polishing conditions were also the same as in Example I-3, and the method for measuring the molecular weight, and the methods for measuring the numbers of scratches and nanoprotrusion were the same as those described above. For conversion ratio, the time when ammonium persulfate was charged after increasing the temperature to 83±2° C. was determined as the start time or 0 minutes for Production Example 1. For Production Example 2, the time at which dripping was started after increasing the temperature to 65±5° C. was determined as 0 minutes.

TABLE 10

| | Ratio of conversion of styrenesulfonic acid Na to conversion of styrene Css/Cst | | | Nanoprotrusions | Scratches (Relative |
| --- | --- | --- | --- | --- | --- |
| | 5 min | 20 min | 60 min | (Relative value) | value) |
| Production Ex. 1 | 2.2 | 1.6 | 1.1 | 49 | 22 |
| Production Ex. 2 | 1.0 | 1.0 | 1.0 | 42 | 19 |

As shown in Table 10 above, it was demonstrated that by setting the ratio of conversions over time to 1.0 as in Production Example 2, the numbers of scratches and nanoprotrusions could be further reduced as compared with Production Example 1.

INDUSTRIAL APPLICABILITY

According to the present invention, it is possible to provide a magnetic disk substrate suitable for achieving a higher recording density, for example.

The invention claimed is:

1. A polishing composition for a magnetic disk substrate, comprising: a copolymer that has a hydrophobic constituent unit derived from a monomer having a solubility of 2 g or less in 100 g of water at 20° C. and a constituent unit having a sulfonic acid group, and has a saturated hydrocarbon chain as the main chain thereof, or a salt of the copolymer; an abrasive; and water;
   wherein the total proportion of the hydrophobic constituent unit and the constituent unit having a sulfonic acid group relative to all the constituent units constituting the polymer is 90 to 100 mol %,
   wherein the hydrophobic constituent unit is derived from styrene, and the constituent unit having a sulfonic acid group is derived from styrenesulfonic acid or its salt, and
   wherein the molar ratio of the constituent unit derived from a monomer having a solubility of 2 g or less 100 g of water at 20° C. to the constituent unit having a sulfonic acid group in all the constituent units constituting the copolymer is 10/90 to 60/40.

2. The polishing composition for a magnetic disk substrate according to claim 1,
wherein the constituent unit having a sulfonic acid group is represented by the general formula (3):

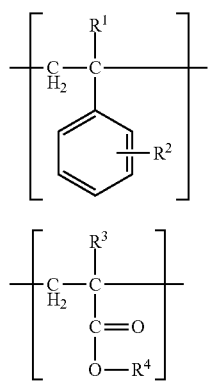

wherein $R^5$ is a hydrogen atom or an alkyl group having 1 to 4 carbon atoms, and $R^6$ is an aryl group having one or more sulfonic acid groups.

3. The polishing composition for a magnetic disk substrate according to claim 1,
wherein the copolymer has a weight-average molecular weight of 1000 to 100000.

4. The polishing composition for a magnetic disk substrate according to claim 1,
wherein the abrasive satisfies the following conditions (a) and (b):
(a) an average particle diameter measured at a detection angle of 90° by dynamic light scattering is of 1 to 40 nm; and
(b) $\Delta CV$ ($\Delta CV=CV30-CV90$) is 0 to 10%, where $\Delta CV$ is a difference between values of coefficients of variation (CVs), of CV30 and CV90, where CV30 is obtained by dividing a particle size standard deviation measured at a detection angle of 30° by dynamic light scattering by an average particle diameter measured at a detection angle of 30° by dynamic light scattering and multiplying the result by 100, and CV90 being obtained by dividing a particle size standard deviation measured at a detection angle of 90° by dynamic light scattering by an average particle diameter measured at a detection angle of 90° by dynamic light scattering and multiplying the result by 100.

5. The polishing composition for a magnetic disk substrate according to claim 1,
wherein the abrasive satisfies the following conditions (c) and (d):
(c) a sphericity measured by observation with a transmission electron microscope is 0.75 to 1; and
(d) a value of surface roughness (SA1/SA2) is 1.3 or greater, where surface roughness (SA1/SA2) is obtained by dividing a specific surface area (SA1) measured by a sodium titration method by a specific surface area (SA2) converted from an average particle diameter (S2) measured by observation with a transmission electron microscope.

6. The polishing composition for a magnetic disk substrate according to claim 1, further comprising a heterocyclic aromatic compound, the heterocyclic aromatic compound comprising two or more nitrogen atoms in the heterocycle thereof.

7. The polishing composition for a magnetic disk substrate according to claim 1, where the molar ratio of the constituent unit derived from a monomer having a solubility of 2 g or less in 100 g of water at 20° C. to the constituent unit having a sulfonic acid group in all the constituent units constituting the copolymer is 15/85 to 50/50.

8. The polishing composition for a magnetic disk substrate according to claim 1, where the molar ratio of the constituent unit derived from a monomer having a solubility of 2 g or less in 100 g of water at 20° C. to the constituent unit having a sulfonic acid group in all the constituent units constituting the copolymer is 20/80 to 40/60.

9. A method for producing a magnetic disk substrate, comprising the step of polishing a substrate to be polished by using the polishing composition according to claim 1.

* * * * *